(12) United States Patent
Izuha et al.

(10) Patent No.: US 7,851,236 B2
(45) Date of Patent: Dec. 14, 2010

(54) FILM THICKNESS PREDICTION METHOD, LAYOUT DESIGN METHOD, MASK PATTERN DESIGN METHOD OF EXPOSURE MASK, AND FABRICATION METHOD OF SEMICONDUCTOR INTEGRATED CIRCUIT

(75) Inventors: Kyoko Izuha, Kanagawa (JP); Keiichi Maeda, Kanagawa (JP); Naoki Komai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/534,254

(22) Filed: Aug. 3, 2009

(65) Prior Publication Data

US 2010/0035367 A1 Feb. 11, 2010

(30) Foreign Application Priority Data

Aug. 7, 2008 (JP) ............................. 2008-204335

(51) Int. Cl.
*H01L 21/66* (2006.01)
(52) U.S. Cl. ................... 438/14; 438/128; 438/129; 438/692; 257/E21.304; 257/E21.529; 257/E21.53
(58) Field of Classification Search .................. 438/23, 438/599, 942; 257/E21.524, E21.529, E21.532, 257/E21.613, E21.702
See application file for complete search history.

(56) References Cited

U.S. PATENT DOCUMENTS 7,363,207 B2 * 4/2008 Kamon ........................ 703/13

FOREIGN PATENT DOCUMENTS

| JP | 3580036 | 7/2004 |
|----|---------|--------|
| JP | 3743120 | 11/2005 |

* cited by examiner

*Primary Examiner*—Charles D Garber
*Assistant Examiner*—Cheung Lee
(74) *Attorney, Agent, or Firm*—SNR Denton US LLP

(57) ABSTRACT

A film thickness prediction method of predicting a film thickness of a second processed layer after planarization includes the steps of: creating first to third actual measurement databases; obtaining a reference film thickness of a second processed layer formed on a region in which no circuit pattern exists; segmenting a first processed layer to be formed on a substrate into grid-like meshes, and obtaining a pattern area ratio occupied by a circuit pattern to be formed on a first processed layer in each mesh and further obtaining a circumferential length of the circuit pattern in each mesh; obtaining an initial thickness of the second processed layer in each mesh; and predicting the film thickness of the second processed layer after planarization from an initial film thickness predicted value and an amount of planarization $H_{ij}$ of the second processed layer in the mesh.

11 Claims, 11 Drawing Sheets

FILM THICKNESS PREDICTION METHOD, LAYOUT DESIGN METHOD, MASK PATTERN DESIGN METHOD OF EXPOSURE MASK, AND FABRICATION METHOD OF SEMICONDUCTOR INTEGRATED CIRCUIT

BACKGROUND OF THE INVENTION

1. Field of the Invention

The present invention relates to a film thickness prediction method, and a layout design method, a mask pattern design method of exposure mask, and a fabrication method of semiconductor integrated circuit to which the film thickness prediction method is applied.

2. Background Art

One of technologies for addressing higher integration of semiconductor integrated circuits, planarization processing is performed at fabrication of semiconductor integrated circuits. One of such planarization processing technologies, a chemical mechanical polishing method (hereinafter, may be referred to as "CMP method") may be cited. FIG. 13 is a conceptual diagram of a polishing apparatus used in the CMP method. This polishing apparatus includes a polishing plate, a substrate holding stage, and a polishing agent slurry supply system. The polishing plate is supported by a rotational shaft of the rotating polishing plate and a polishing pad is provided on the surface thereof. The substrate holding stage is located above the polishing plate and supported by a substrate holding stage rotational shaft. For example, when the substrate is polished, the substrate is mounted on the substrate holding stage. The substrate holding stage rotational shaft is attached to a polishing pressure adjustment mechanism (not shown) for pressing the substrate holding stage toward the polishing pad. Further, the polishing plate is rotated while polishing agent slurry containing the polishing agent is supplied from the polishing agent slurry supply system to the polishing pad. Concurrently, while the substrate mounted on the substrate holding stage is rotated, the polishing pressure adjustment mechanism adjusts polishing pressure of the substrate against the polishing pad. In this way, the surface of the substrate can be polished.

When a thin film is formed on a circuit pattern and the thin film is planarized, it is extremely important to predict a thickness of the planarized thin film in advance for early solution to problems in semiconductor device manufacture and reduction in manufacturing cost. Further, in view of a characteristic analysis of semiconductor device, i.e., timing closure of integrated circuit, especially, in RC extraction, information on a sectional structure of semiconductor device is used. For this, it is necessary to predict a value of the film thickness of a thin film formed on a circuit pattern and to be planarized.

As a basic theory relating to polishing, there is Preston's law. This law is based on the assumption that a polishing rate is proportional to an amount of planarization work (amount of friction work) per unit area and time. Given that a relative velocity of a surface to be polished of a substrate and a polishing plate is v, pressure is P (constant regardless of polishing time t during polishing), and a remaining height of the surface of a thin film to be polished is X, the polishing rate can be expressed by the following equation (A), where "c" is a constant.

$$-dX/dt = c \cdot v \cdot P \quad \text{(A)}$$

For example, Japanese Patent No. 3580036 discloses a simulation method when a substrate is sandwiched between a polishing head and a polishing cloth and projections and depressions formed on the substrate are polished. In the simulation method, a function expressing the height of the projections and depressions after a polishing time is elapsed with pressure applied by the polishing head to the substrate, a relative velocity between the polishing cloth and the substrate, an initial level difference between projections and depressions, the polishing time, Young's modulus of the polishing cloth, a thickness of the polishing cloth, and a density distribution of projections and depressions in a predetermined location on the substrate as parameters and an independent parameter of the pressure for the density distribution of projections and depressions is obtained in advance. For obtaining the height of the projections and depressions after a predetermined polishing time is elapsed, the pressure, the relative velocity, the initial level difference, the polishing time, the Young's modulus, the thickness of the polishing cloth, and the density distribution of projections and depressions are substituted into the function, and the final height of the projections and depressions after the polishing time is elapsed is directly obtained.

Further, for example, Japanese Patent No. 3743120 discloses a method of fabricating a semiconductor integrated circuit by forming a pattern on a first processed layer formed on a substrate, then forming a second processed layer on an entire surface, and planarizing the second processed layer by a chemical mechanical polishing method. In the method of fabricating a semiconductor integrated circuit, a mask pattern to be formed on an exposure mask used for pattern formation is designed according to a design method of the mask pattern including the steps of:

(i) segmenting the mask pattern into grid-like meshes having a predetermined size and obtaining a pattern area ratio $\alpha_{ij}$ in each mesh (i,j);

(ii) obtaining a pattern area ratio average value $\beta(i,j)$ within a predetermined region centered around the mesh (i,j) of the mask pattern; and (iii) providing a dummy pattern in the mesh (i,j) in which the pattern area ratio average value $\beta(i,j)$ is less than a prescribed value, and the pattern is formed on the first processed layer using the exposure mask fabricated according to the design method.

SUMMARY OF THE INVENTION

These methods disclosed in the patents are very effective and useful technologies. However, although the film thickness of the thin film formed on the circuit pattern may be affected by the pattern area ratio of the circuit pattern, those technologies do not take the influence into consideration. Further, among polishing agents used in the CMP method, there is a polishing agent having strong chemical affinity, and the polishing rate may change depending on the polishing condition for the polishing agent and the rate may not simply obey the above mentioned Preston's equation (A). Accordingly, using such a polishing agent, it may be difficult to predict the film thickness of the thin film formed on the circuit pattern.

Therefore, it is desirable to provide a film thickness prediction method by which a film thickness of a thin film formed on a circuit pattern can be predicted more accurately even when the film thickness of the thin film formed on the circuit pattern is affected by a pattern area ratio of the circuit pattern, and further, a polishing rate changes depending on a polishing condition and does not simply obey the Preston's equation, and a layout design method, a mask pattern design method of exposure mask, and a fabrication method of semiconductor integrated circuit to which the film thickness prediction method is applied or adopted.

A film thickness prediction method according to an embodiment of the invention is to predict a film thickness of a second processed layer after planarization when a circuit pattern is formed on a first processed layer formed on a substrate, then a second processed layer is formed on an entire surface, and the second processed layer is planarized.

The film thickness prediction method according to the embodiment of the invention includes the steps of:

by using a test substrate provided with various test circuit patterns, forming a second processed layer on the various test circuit patterns, measuring a thickness of the formed second processed layer, and performing planarization processing on the formed second processed layer, creating, in advance, (1) a first actual measurement database related to a relationship between the circuit pattern and a sectional structure (so-called a device sectional structure) of the second processed layer formed thereon, (2) a second actual measurement database related to a relationship between a circumferential length of the circuit pattern and the thickness of the second processed layer formed thereon, and (3) a third actual measurement database related to a relationship between the circuit pattern and a planarization rate of the second processed layer formed thereon;

obtaining, in advance, (4) a reference film thickness $T_{blk}$ of the second processed layer formed on a region in which no circuit pattern exists (so-called a field region);

(A) segmenting a first processed layer to be formed on the substrate into grid-like meshes having a predetermined size, and obtaining a pattern area ratio $\alpha_{ij}$ occupied by the circuit pattern to be formed on the first processed layer in each mesh (i,j) and further obtaining a circumferential length $L_{ij}$ of the circuit pattern in each mesh (i,j);

(B) obtaining an initial thickness $T_{2\_INI\_ij}$ of the second processed layer in each mesh (i,j) from the circumferential length $L_{ij}$ of the circuit pattern based on the second actual measurement database; and (C) predicting the film thickness of the second processed layer after planarization of the second processed layer from an initial film thickness predicted value $Pr_{ij}$ of the second processed layer in the mesh (i,j) obtained based on the pattern area ratio $\alpha_{ij}$ and the reference film thickness $T_{blk}$ of the second processed layer, the initial thickness $T_{2\_INI\_ij}$ of the second processed layer, and an amount of planarization $H_{ij}$ of the second processed layer in the mesh (i,j) obtained based on the first actual measurement database, the second actual measurement database, and the third actual measurement database.

A layout design method according to another embodiment of the invention is a layout design method of designing a layout of a semiconductor circuit based on semiconductor integrated circuit design data.

Further, according to the above described film thickness prediction method of the embodiment of the invention, a circuit pattern is formed on a first processed layer formed on a substrate, then a second processed layer is formed on an entire surface, and a film thickness of the second processed layer after planarization of the second processed layer is predicted, and capacitance extraction is performed based on the predicted film thickness of the second processed layer and delay calculation or timing analysis or delay calculation and timing analysis are performed.

A layout design method according to still another embodiment of the invention is a layout design method of designing a layout of a semiconductor circuit based on semiconductor integrated circuit design data.

Further, according to the above described film thickness prediction method of the embodiment of the invention, a circuit pattern is formed on a first processed layer formed on a substrate, then a second processed layer is formed on an entire surface, a film thickness of the second processed layer after planarization of the second processed layer is predicted, and a dummy pattern is provided on the first processed layer so that the predicted film thickness of the second processed layer may fall within a desired film thickness range. Here, "dummy pattern" refers to a pattern that forms no circuit of the semiconductor integrated circuit.

A mask pattern design method of exposure mask of still another embodiment of the invention is a design method, when a pattern is formed on a first processed layer formed on a substrate, then a second processed layer is formed on an entire surface, and the second processed layer is planarized and a semiconductor integrated circuit is fabricated, of a mask pattern to be formed on an exposure mask used for the pattern formation.

Further, according to the above described film thickness prediction method of the embodiment of the invention, a circuit pattern is formed on a first processed layer formed on a substrate, then a second processed layer is formed on an entire surface, a film thickness of the second processed layer after planarization of the second processed layer is predicted, a layout of a semiconductor circuit is designed by providing a dummy pattern on the first processed layer so that the predicted film thickness of the second processed layer may fall within a desired film thickness range, and a mask pattern for exposure mask for the first processed layer is designed based on the layout design of the semiconductor circuit.

Here, "mask pattern" refers to a pattern for one chip to be formed on the exposure mask. The reference is applied to the following description. Typically, plural chips are fabricated on one wafer by the exposure mask.

A fabrication method of semiconductor integrated circuit according to still another embodiment of the invention is a fabrication method of semiconductor integrated circuit of fabricating a semiconductor integrated circuit by forming a pattern on a first processed layer formed on a substrate, then forming a second processed layer on an entire surface, and planarizing the second processed layer.

Further, according to the above described film thickness prediction method of the embodiment of the invention, a circuit pattern is formed on a first processed layer formed on a substrate, then a second processed layer is formed on an entire surface, a film thickness of the second processed layer after planarization of the second processed layer is predicted, a layout of a semiconductor circuit is designed by providing a dummy pattern is provided on the first processed layer so that the predicted film thickness of the second processed layer may fall within a desired film thickness range, and the circuit pattern is formed on the first processed layer based on the layout design of the semiconductor circuit.

In the film thickness prediction method according to the embodiment of the invention, the layout design method according to the embodiment of the invention including the above described preferred embodiments, the mask pattern design method of exposure mask according to the embodiment of the invention, or the fabrication method of semiconductor integrated circuit according to the embodiment of the invention (hereinafter, these may be collectively and simply referred to as "the embodiments of the invention"), the planarization processing may be performed according to the chemical mechanical polishing method (CMP method). Hereinafter, the embodiments of the invention may be referred to as "the method of the embodiments of the invention according to the CMP method". Note that the planarization processing is not limited to the CMP method, but may be performed according to other methods such as an electrolytic polishing method.

In the method of the embodiments of the invention according to the CMP method, the initial film thickness predicted value $Pr_{ij}$ of the second processed layer may be obtained based on the reference film thickness $T_{blk}$ of the second processed layer, the pattern area ratio $\alpha_{ij}$, a thickness $T_{1\_INI\_ij}$ of the first processed layer in the mesh (i,j), and the circumferential length $L_{ij}$ of the circuit pattern.

In this case or the method of the embodiments of the invention according to the CMP method, it is desirable that the amount of planarization (the amount of polishing or amount of scraping) $H_{ij}$ of the second processed layer is obtained based on a relationship between the polishing pressure and the planarization rate according to the change in sectional structure (device sectional structure) of the second processed layer in the mesh (i,j) during planarization processing of the second processed layer. Here, in a condition that the sectional structure of the second processed layer does not greatly change during the planarization processing of the second processed layer (for convenience, referred to as "condition-A"), the planarization rate is proportional to the amount of planarization work (amount of friction work) per unit area and time in "condition-A", and, the sectional structure of the second processed layer greatly changes and then turns into a condition that the sectional structure of the second processed layer does not greatly change (for convenience, referred to as "condition-B"), the planarization rate is proportional to the amount of planarization work (amount of friction work) per unit area and time in "condition-B".

Further, the initial film thickness predicted value $Pr_{ij}$ of the second processed layer may be obtained by the following equation (1) and a film thickness $T_{2\_END\_ij}$ of the second processed layer at completion of the planarization processing when no second processed layer exists on the circuit pattern of the first processed layer may be predicted by the following equation (2).

$$Pr_{ij} = (1-\alpha_{ij})T_{1\_INI\_ij} + T_{blk}(1+k_1 \cdot L_{ij})k_2 \cdot k_3 \quad (1)$$

$$T_{2\_END\_ij} = Pr_{ij} - k_4 \cdot H_{ij} \quad (2)$$

Here, the initial film thickness predicted value $Pr_{ij}$, $T_{2\_END\_ij}$ and $H_{ij}$ are values with reference to a top surface of the circuit pattern of the first processed layer, $k_1$ is a constant, $k_2$ is a coefficient according to the area of the circuit pattern, $k_3$ is a coefficient according to formation of the second processed layer, and $k_4$ is a coefficient according to planarization processing of the second processed layer.

The values of $k_1$, $k_2$, $k_3$, $k_4$ may be obtained together with the first actual measurement database, the second actual measurement database, and the third actual measurement database by using a test substrate provided with various test circuit patterns, forming the second processed layer on the various test circuit patterns, measuring the thickness of the formed second processed layer, and further performing planarization processing on the formed second processed layer. These values are stored in relation to the circuit pattern in the third actual measurement database, for example.

In the embodiments of the invention including the above described various preferred embodiments and configurations, the test circuit pattern may be a circuit pattern with a pattern area ratio and a circumferential length intermittently or continuously changed, and specifically, the test circuit pattern may be a TEG pattern.

In the embodiments of the invention including the above described preferred embodiments, as combinations of (first processed layer)/(second processed layer) in the device structure, combinations of (impurity-doped polycrystalline silicon layer/insulating layer), (metal layer of aluminum-based tungsten alloy, copper, silver, or the like/insulating layer), (metal compound layer of tungsten silicide, titanium silicide, or the like/insulating layer), (multilayered structure of impurity-doped polycrystalline silicon layer and metal compound layer of tungsten silicide, titanium silicide, or the like/insulating layer), and (multilayered structure of impurity-doped polycrystalline silicon layer, metal compound layer of tungsten silicide, titanium silicide, or the like and insulating layer/insulating layer) may be taken as examples. Alternatively, combinations of (insulating layer/impurity-doped polycrystalline silicon layer), (insulating layer/metal layer of aluminum-based alloy, tungsten, copper, silver, or the like), (insulating layer/metal compound layer of tungsten silicide, titanium silicide, or the like), (insulating layer/multilayered structure of impurity-doped polycrystalline silicon layer and metal compound layer of tungsten silicide, titanium silicide, or the like) and (insulating layer/multilayered structure of impurity-doped polycrystalline silicon layer, metal compound layer of tungsten silicide, titanium silicide, or the like and insulating layer) may be taken as examples.

In the embodiments of the invention, the first processed layer is formed on the substrate, however, the first processed layer may be formed on the substrate or formed above the substrate. In the latter case, the first processed layer is formed on a foundation layer. The foundation layer may be flat or not. The foundation layer may be a layer forming the first processed layer or a layer forming the second processed layer. Further, the substrate maybe a silicon semiconductor substrate, or glass substrate, silica substrate, or the like. The embodiments of the invention may be applied to a multilayer configuration for which the film thickness of the second processed layer to be formed on the first processed layer is predicted and the second processed layer having the predicted film thickness is considered as a new first processed layer and a film thickness of a new second processed layer to be formed thereon is predicted.

In the embodiments of the invention, the initial thickness $T_{2\_INI\_ij}$ of the second processed layer in the mesh (i,j) is obtained from the circumferential length $L_{ij}$ of the circuit pattern that greatly affects the film thickness prediction of the second processed layer based on the second actual measurement database, and further, the film thickness of the second processed layer after planarization of the second processed layer is predicted from the initial film thickness predicted value $Pr_{ij}$ of the second processed layer in the mesh (i,j) obtained based on the pattern area ratio $\alpha_{ij}$ and the reference film thickness $T_{blk}$ of the second processed layer, the initial thickness $T_{2\_INI\_ij}$ of the second processed layer, and the amount of planarization $H_{ij}$ of the second processed layer in the mesh (i,j) obtained based on the first actual measurement database, the second actual measurement database, and the third actual measurement database. Here, for obtaining the amount of planarization $H_{ij}$ of the second processed layer, the relationship between the circuit pattern and the sectional structure of the second processed layer (related to the first actual measurement database), the thickness of the second processed layer (related to the second actual measurement database), and the planarization rate of the second processed layer (related to the third actual measurement database) are referred to. Therefore, with reference to these actual measurement databases, even when the film thickness of the thin film formed on the circuit pattern is affected by the pattern area ratio of the circuit pattern as the foundation layer, the film thickness of the second processed layer after planarization processing can be predicted with high accuracy. In addition, for example, among polishing agents used in the CMP method, there is a polishing agent having strong chemical affinity, and the polishing rate may change depending on the polishing condition for the polishing agent, however, in spite of that, the film thickness of the second processed layer after planarization processing can be predicted with high accuracy by referring to the first, second, and third actual measurement databases as described above. Since the film thickness of the second processed layer after planarization processing can be predicted with high accuracy, the layout design with higher accuracy, the mask pattern design method of exposure mask with higher accuracy, and the formation of semiconductor integrated circuit with higher accuracy can be achieved.

DESCRIPTION OF PREFERRED INVENTION

Hereinafter, embodiments of the invention will be described according to examples with reference to the drawings.

EXAMPLE 1

Figure 1:
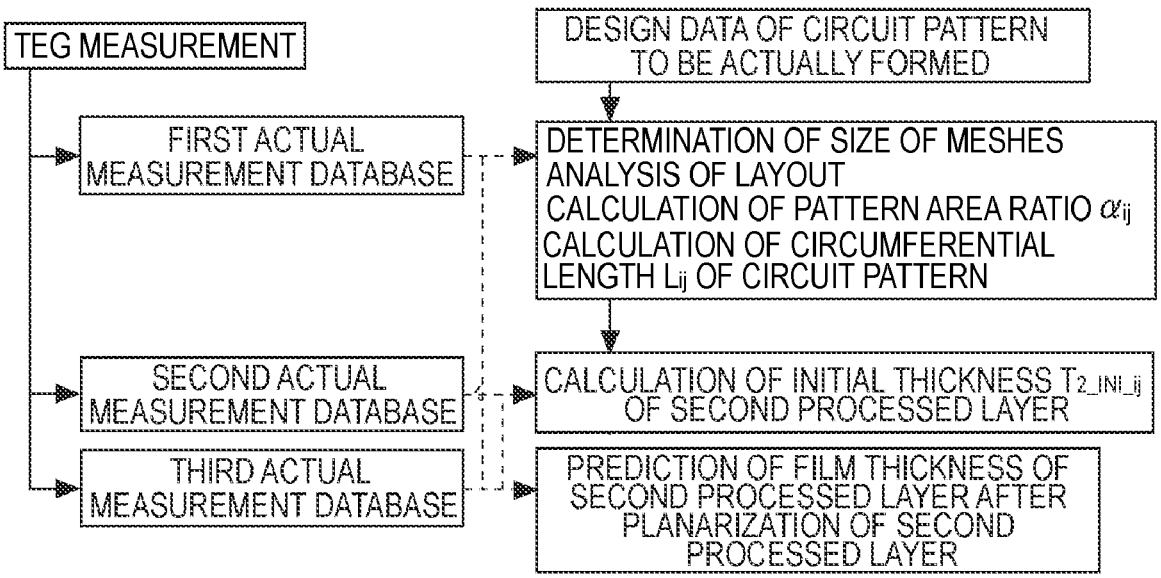
FIG. 1 is a flowchart for explanation of an outline of a film thickness prediction method of Example 1.
Figure 1:
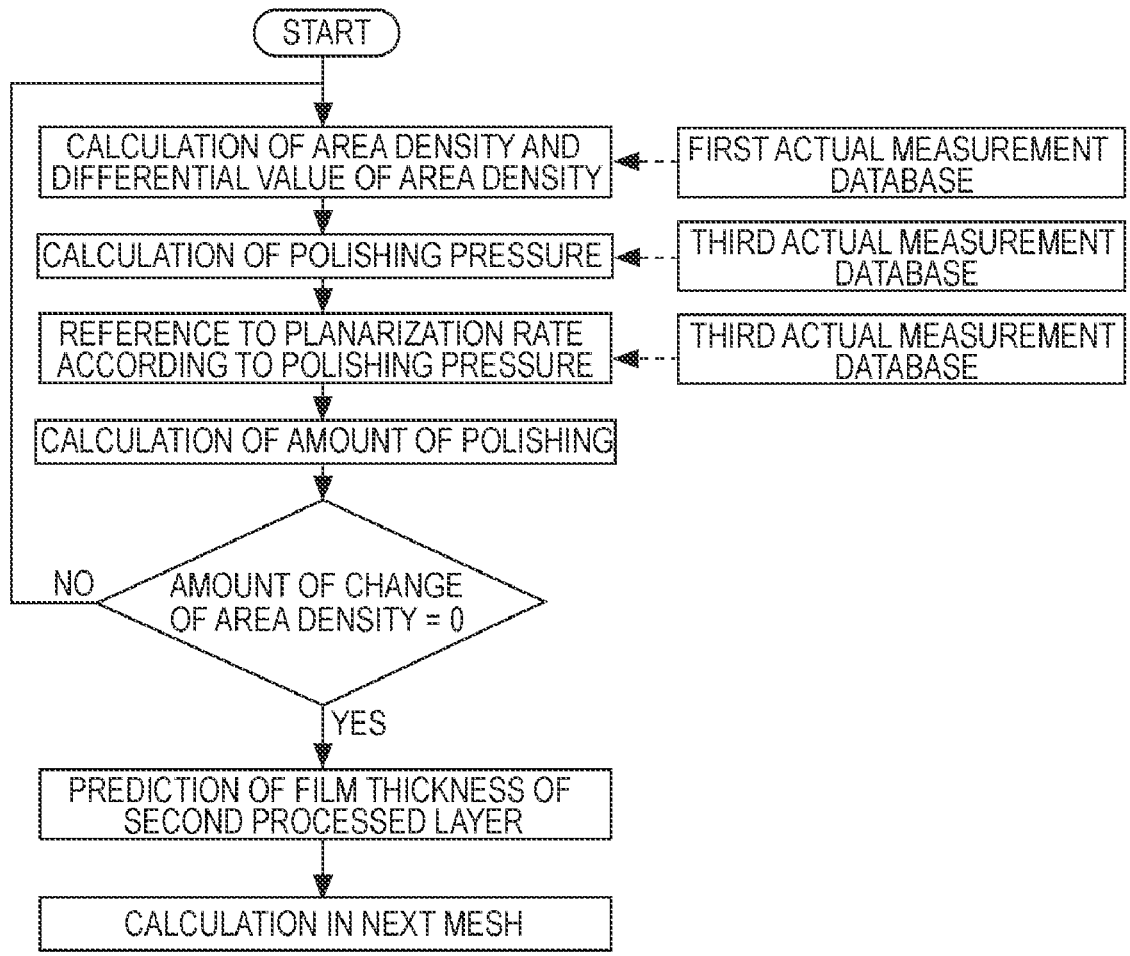
Figure 13:
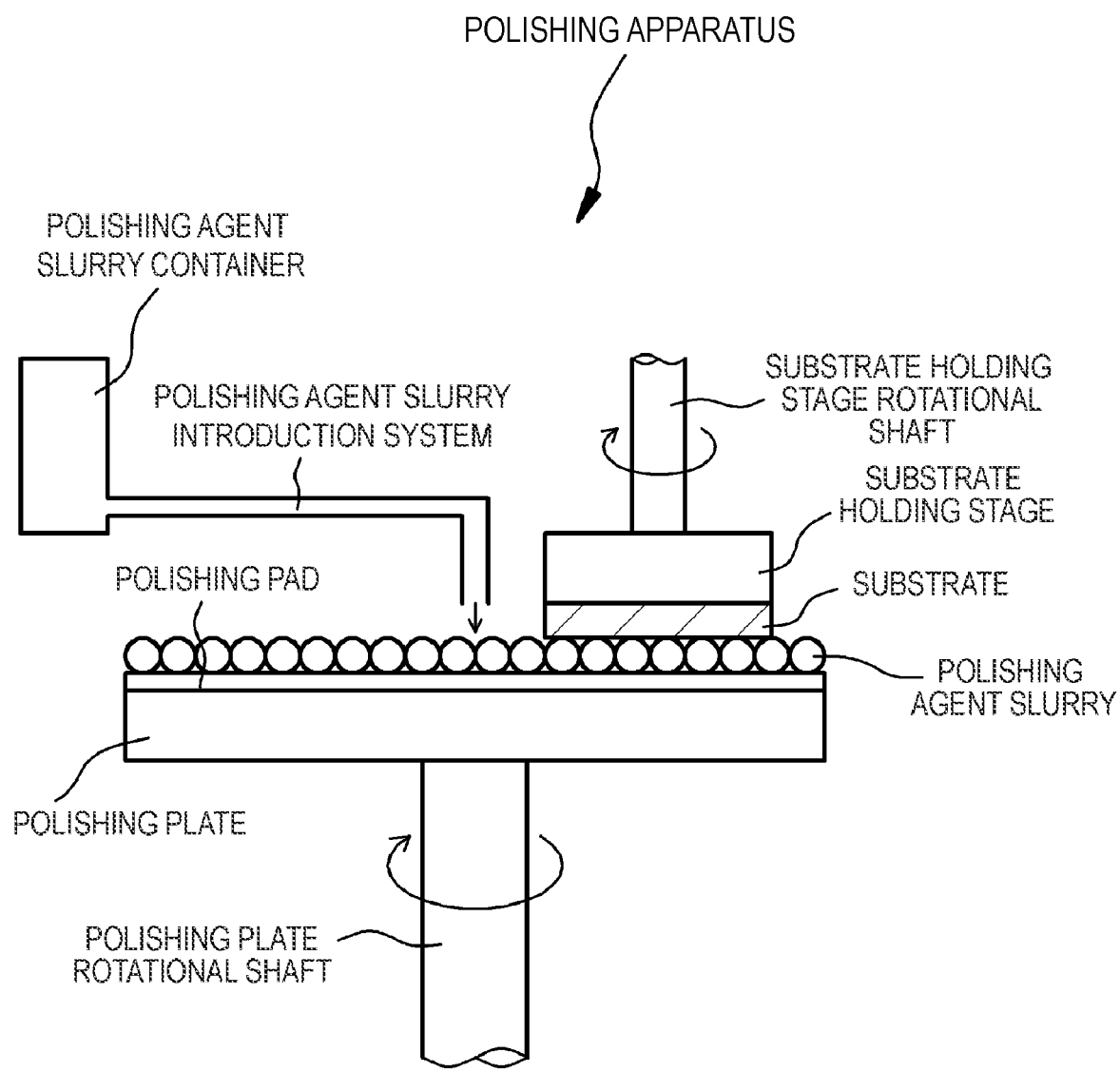
FIG. 13 is a conceptual diagram of a polishing apparatus used in the chemical mechanical polishing method.

Example 1 relates to a film thickness prediction method according to an embodiment of the invention. FIG. 1 is a flowchart for explanation of an outline of a film thickness prediction method of Example 1. The film thickness prediction method of Example 1 is a film thickness prediction method of forming a circuit pattern on a first processed layer formed on a substrate, then forming a second processed layer on an entire surface, and predicting a film thickness of the second processed layer after planarization of the second processed layer. The planarization processing is performed according to a chemical mechanical polishing method (CMP method) using a polishing apparatus shown in FIG. 13. In Example 1, the first processed layer is an insulating layer of $SiO_2$, the second processed layer is a copper (Cu) layer formed by plating, and wiring having a so-called damascene structure is formed by the first processed layer and the second processed layer. Specifically, a manufacturing process of a semiconductor device of forming a groove part as a circuit pattern on the first processed layer, embedding the groove part with the second processed layer by plating, polishing the second processed layer by the CMP method, and providing embedded wiring is assumed.

As below, the film thickness prediction method of Example 1 will be explained.

[Step-100]

First, using a test substrate provided with various test circuit patterns, a second processed layer is formed on the various test circuit patterns, a thickness of the formed second processed layer is measured, and further, planarization processing is performed on the formed second processed layer.

Specifically, a circuit pattern with a pattern area ratio and a circumferential length intermittently or continuously changed is used as the test circuit pattern. The test circuit pattern may be any polygon with a pattern area ratio and a circumferential length intermittently or gradually changed. For example, as the test circuit pattern, a TEG (Test Element Group) pattern, more specifically, TEG 854 of MIT/SEMATECH may be used.

Figure 2A:
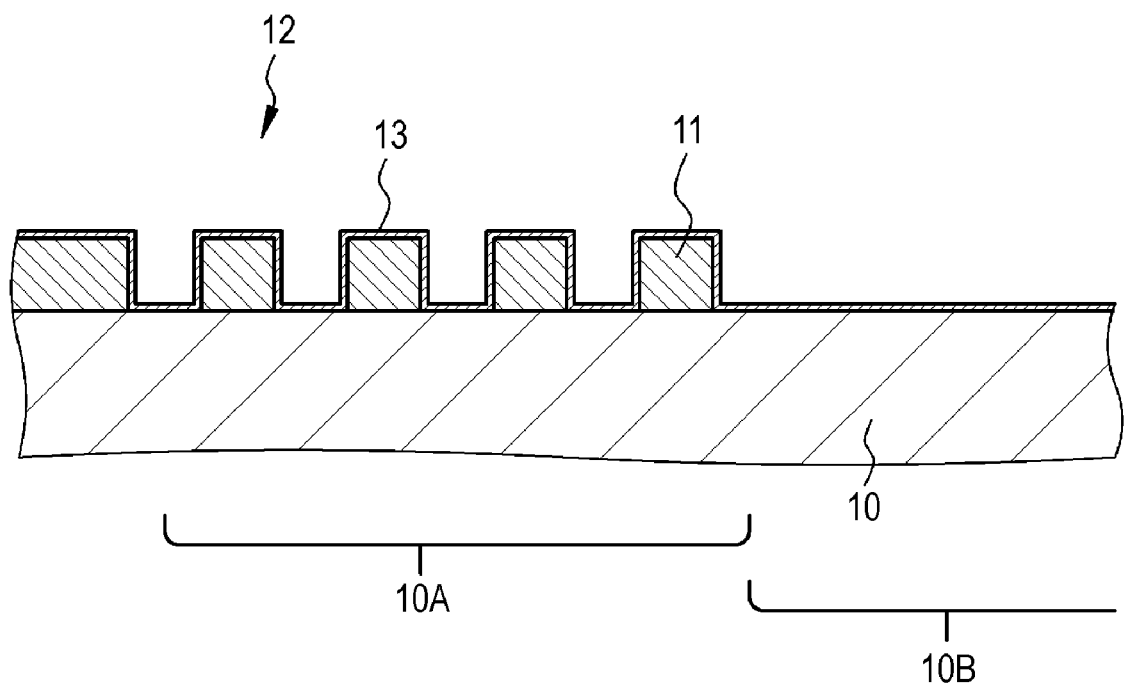
FIGS. 2A and 2B are schematic partial end surface diagrams of a silicon semiconductor substrate etc. for explanation of the step of using a test substrate provided with various test circuit patterns, forming a second processed layer on the various test circuit patterns, and performing planarization processing on the formed second processed layer.

Further, using an actual semiconductor device manufacturing line, an insulating layer of $SiO_2$ as a first processed layer 11 is formed on a silicon semiconductor substrate, and a pattern is formed on the first processed layer 11 according to lithography and etching technologies. Thus, a test substrate 10 provided with various test circuit patterns 12 can be obtained. Many circuit patterns are formed in a region 10A of the test substrate 10. On the other hand, no circuit pattern is formed in a region 10B of the test substrate 10. Then, in Example 1, a barrier metal layer 13 of TaN having a thickness of 10 nm is formed on the entire surface by sputtering. In this manner, a structure shown in FIG. 2A can be obtained.

Figure 2B:
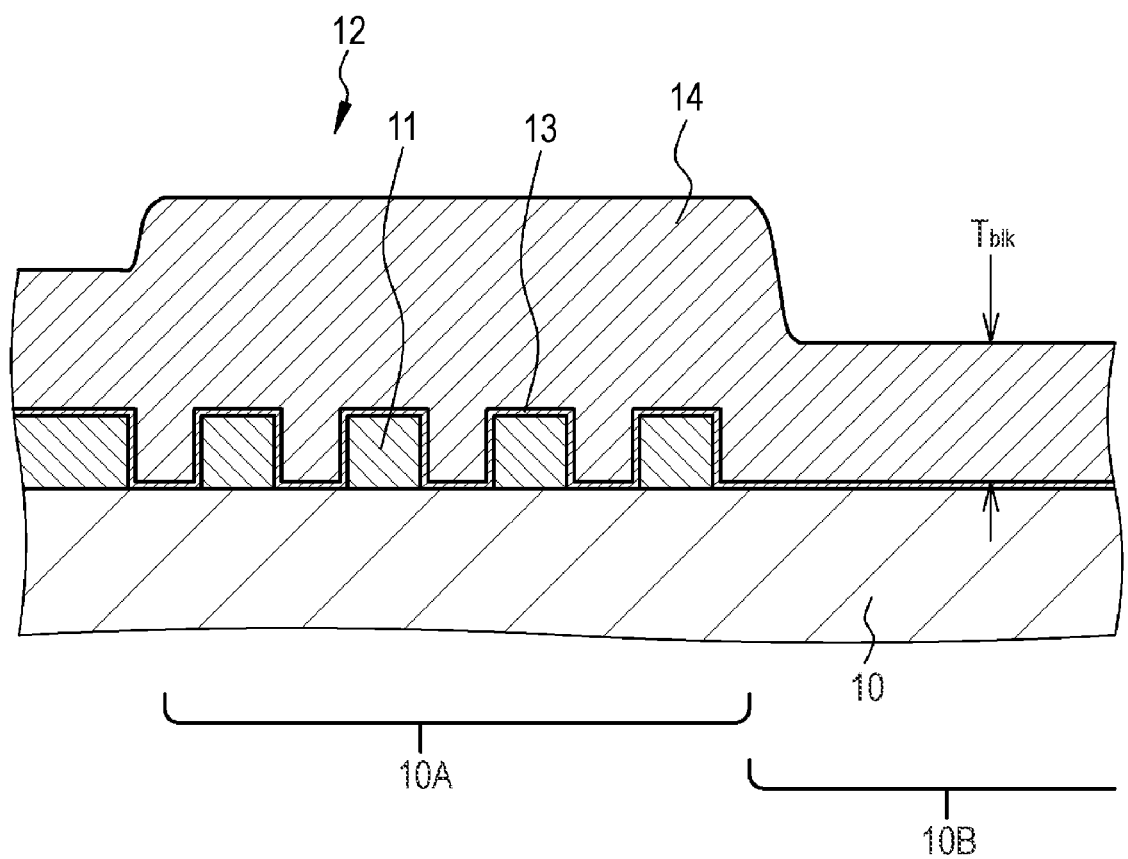

Subsequently, a second processed layer 14 is formed on the test substrate 10 and the test circuit patterns 12. Specifically, the second processed layer 14 of a copper (Cu) layer is formed on the entire surface by plating (see FIG. 2B).

Then, the thickness (plated film thickness) of the second processed layer 14 formed on the various test circuit patterns 12 is measured (actually measured).

Figure 3A:
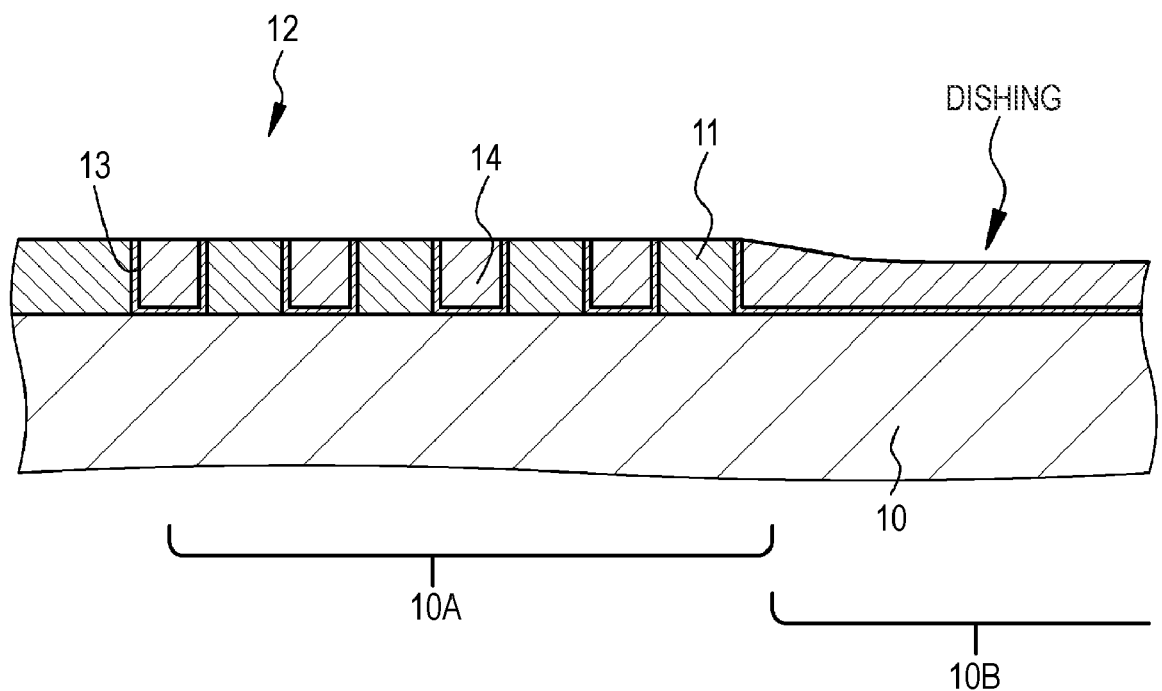
FIG. 3A is a schematic partial end surface diagram of a silicon semiconductor substrate etc. subsequent to FIG. 2B for explanation of the step of using a test substrate provided with various test circuit patterns, forming a second processed layer on the various test circuit patterns, and performing planarization processing on the formed second processed layer, and FIG. 3B schematically shows a circuit pattern that occupies mesh (i,j), mesh (i+1,j), mesh (i,j+1), mesh (i+1,j+1).

Subsequently, planarization processing is performed on the second processed layer 14 formed on the various test circuit patterns 12 according to the CMP method. In this manner, a structure shown in FIG. 3A can be obtained.

When planarization processing is performed on the second processed layer 14 according to the CMP method, the planarization processing is stopped at the time when the top surface of the circuit patterns (the top surface of the first processed layer 11) is exposed in the region 10A (the region with a high pattern area ratio) of the test substrate 10 on which many circuit patterns have been formed. At this time, in the region 10B (the region with a low pattern area ratio) of the test substrate 10 on which no circuit pattern has been formed, a dishing phenomenon that the second processed layer 14 is excessively polished often occurs. Such a phenomenon is not limited to the test substrate 10 but often recognized in typical semiconductor device manufacturing. Due to the occurrence of the dishing phenomenon, prediction of the film thickness of the second processed layer 14 after planarization of the second processed layer 14, i.e., prediction of the dishing condition is extremely important.

Figure 4A:
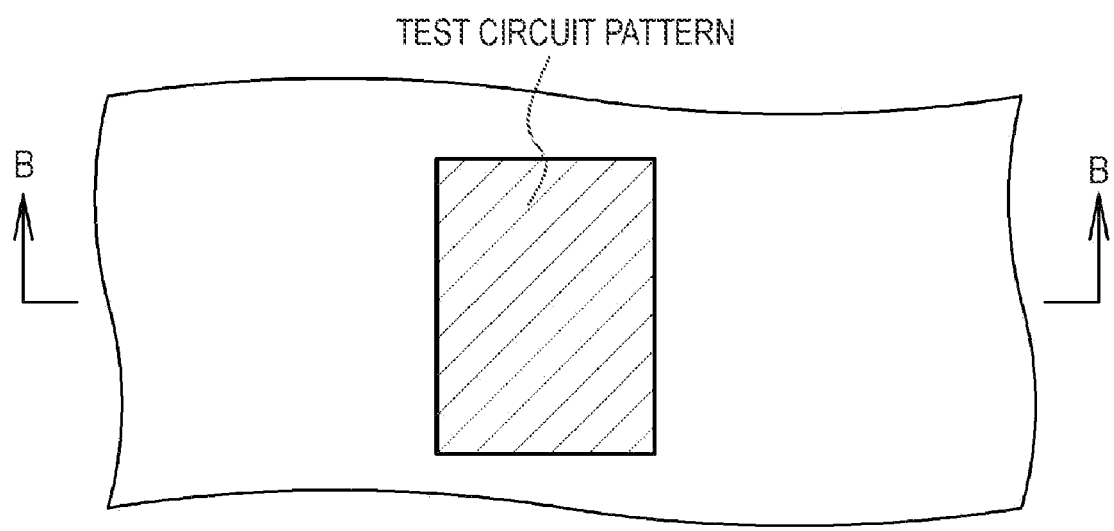
FIG. 4A is a schematic plan view of the test circuit pattern and FIG. 4B shows a sectional structure (device sectional structure, sectional profile) of the second processed layer formed on the test circuit pattern.
Figure 4B:
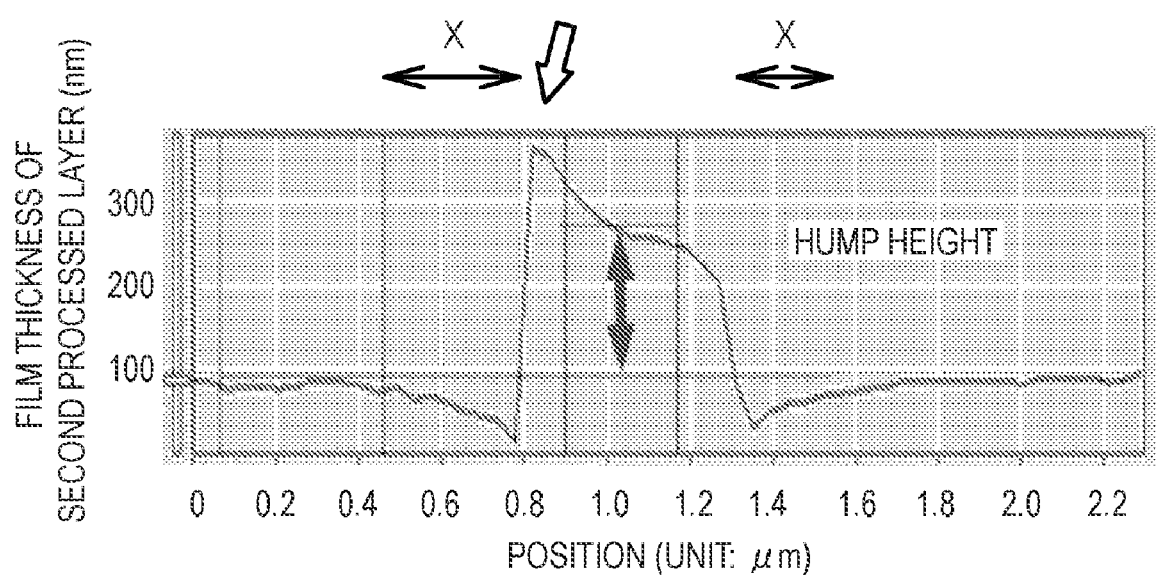

In Example 1, a first actual measurement database related to a relationship between the circuit pattern and a sectional structure (device sectional structure) of the second processed layer formed thereon is obtained. FIG. 4A is a schematic plan view of the test circuit pattern and FIG. 4B shows a measurement result of a sectional structure (sectional profile) along an arrow B-B in FIG. 4A. The sectional structure shows how the second processed layer (plated layer) has been formed on and near the test circuit pattern. From FIG. 4B, it is recognized that the film thickness of the second processed layer is thinner in the edge part of the test circuit pattern and the film thickness of the second processed layer is extremely thicker on the test circuit pattern. More specifically, from left to right of FIG. 4B, the film thickness of the second processed layer gradually decreases from the region where no test circuit pattern exists toward the edge part of the test circuit pattern. In the edge part of the test circuit pattern, the film thickness of the second processed layer is very thin. Further, on the test circuit pattern, the film thickness of the second processed layer becomes larger to be pointed, and then, a flat part is produced in the film thickness of the second processed layer. Furthermore, the film thickness of the second processed layer becomes very thin again at the opposite edge part of the test circuit pattern, and gradually thicker as it apart from the opposite edge part of the test circuit pattern.

In this way, the relationships between the test circuit pattern and the sectional structure of the second processed layer can be obtained by measuring the thickness of the second processed layer, the circumferential length, and the like on and near the various test circuit patterns formed on the first processed layer. Further, the relationships are put together and the generalized first actual measurement database related to a relationship between the circuit pattern and a sectional structure (device sectional structure) of the second processed layer formed thereon can be obtained. Here, as shown in FIG. 4B, the film thickness of the second processed layer in a part where the film thickness of the second processed layer does not largely change on the test circuit pattern is referred to as "hump height" for convenience, and the hump height is considered as a substantial thickness of the second processed layer. Note that the relationship between the circuit pattern and the sectional structure of the second processed layer formed thereon varies depending on the manufacturing line of semiconductor devices, the formation condition of the second processed layer (e.g., plating conditions), or the like. Therefore, the first actual measurement database is an actual measurement database with parameters of the manufacturing line of semiconductor devices, formation condition of the second processed layer, or the like.

In the film thickness prediction method of Example 1, as will be described later, it is necessary to segment the first processed layer to be formed on the substrate into grid-like meshes having a predetermined size. Here, it is desirable that the size of meshes is set to a size containing at least the region (the regions shown by arrows X in FIG. 4B) where the film thickness of the second processed layer that has once decreased becomes a desired film thickness near the test circuit pattern. By thus setting the size of the meshes, various influences due to variations in film thickness of the second processed layer near the circuit pattern can be eliminated. Sizes of those regions are obtained in various test circuit patterns. Then, the predetermined size of the meshes may be determined based on the maximum size of the region. In Example 1, the predetermined size of the meshes is set to 100 μm. Note that the predetermined size of the meshes may vary depending on the manufacturing line of semiconductor devices, the formation condition of the second processed layer, or the like. If the relationships between circuit patterns as targets and predetermined sizes of meshes are stored in the first actual measurement database, when the first processed layer to be formed on the substrate is segmented into grid-like meshes having a predetermined size, the predetermined size of meshes can be obtained from the first actual measurement database by searching for circuit pattern design data as a target.

Figure 5A:
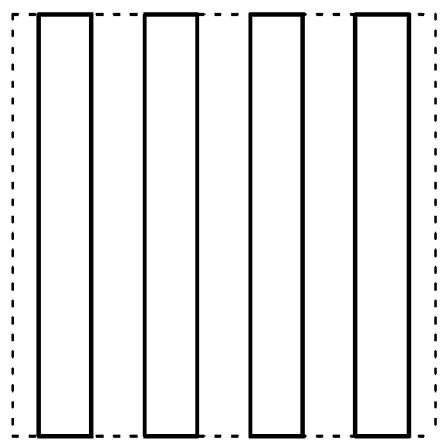
FIGS. 5A to 5D are schematic plan views of various test circuit patterns.
Figure 5B:
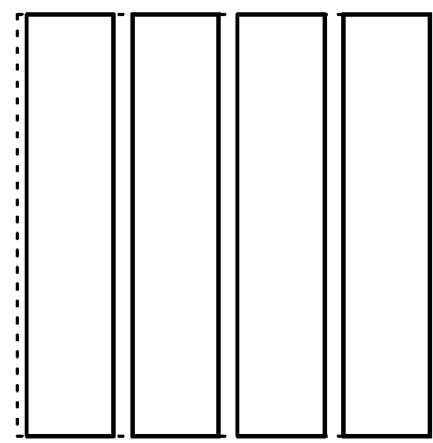
Figure 5C:
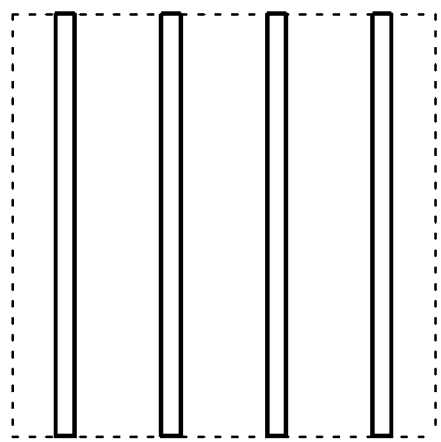
Figure 5D:
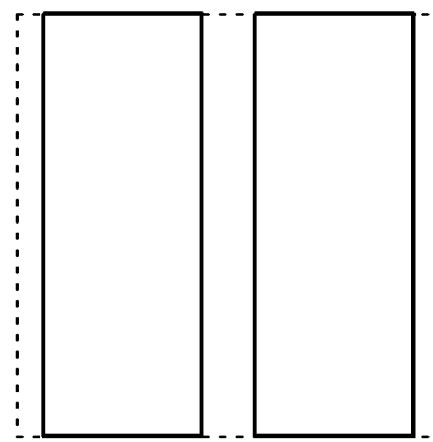

Further, a second actual measurement database related to a relationship between the circumferential length of the circuit pattern and the thickness of the second processed layer formed thereon is obtained. As schematically shown in FIGS. 5A to 5D, if the occupied area ratios of the circuit patterns within a fixed area are the same, sums of the circumferential lengths of the circuit patterns are different. In a line-and-space (LS) pattern as shown in FIG. 5A, the area ratio of the circuit pattern is 50% and the circumferential length of the circuit pattern within a unit area is long. Similarly, in the circuit pattern shown in FIG. 5B, the circumferential length is long and the area ratio is high. On the other hand, in the example shown in FIG. 5C, the circumferential length is long, but the area ratio is low. Further, in the example shown in FIG. 5D, the area ratio is high, but the circumferential length is short.

Figure 6:
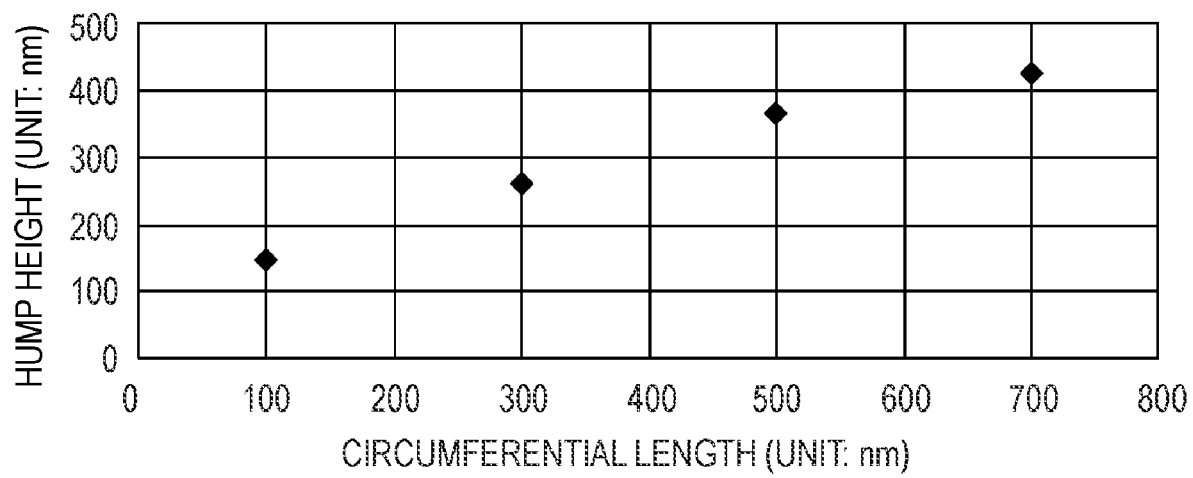
FIG. 6 is a graph showing a result of investigation of a relationship between the circumferential length of the test circuit pattern and the hump height as an example.

FIG. 6 shows a result of investigation of a relationship between the circumferential length of the test circuit pattern and the hump height as an example. From FIG. 6, it is seen that, as the circumferential length of the test circuit pattern is longer, the hump height linearly increases. Note that the relationship between the circumferential length of the circuit pattern and the thickness of the second processed layer formed thereon also varies depending on the manufacturing line of semiconductor devices, the formation condition of the second processed layer, or the like. Therefore, the second actual measurement database is an actual measurement database with parameters of the manufacturing line of semiconductor devices, formation condition of the second processed layer, or the like.

Figure 7A:
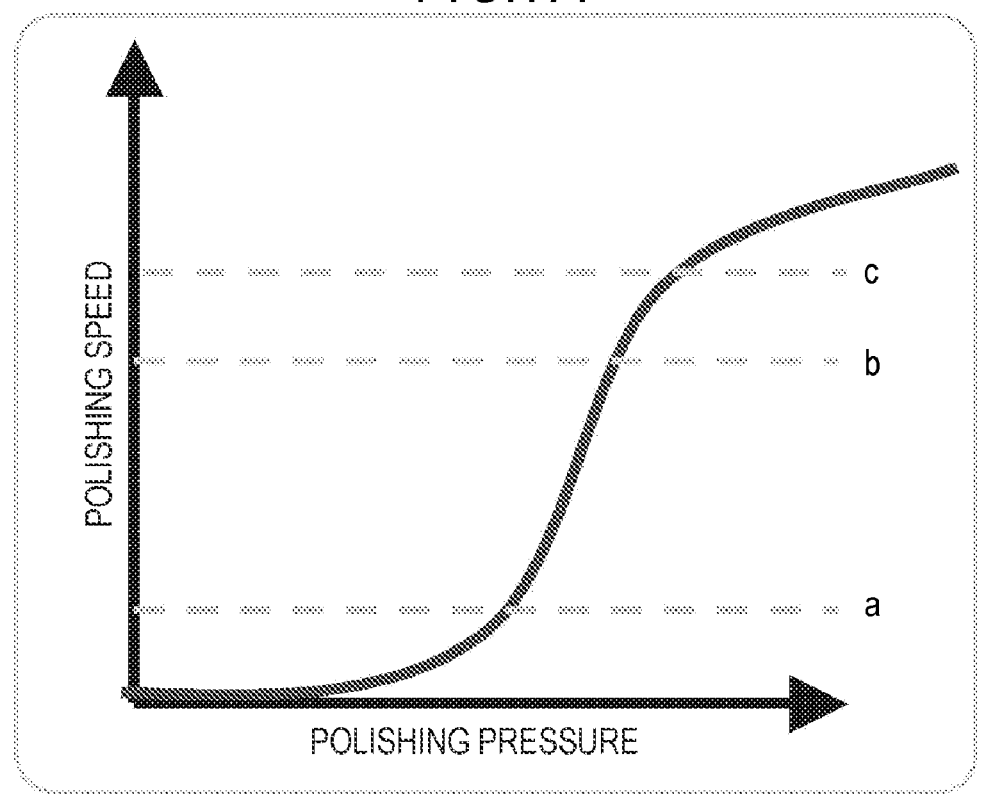
FIGS. 7A and 7B are graphs respectively showing an example of a relationship between the polishing pressure and the polishing rate when planarization processing is performed on the second processed layer formed on the various test circuit patterns according to the CMP method and an example of a relationship between the polishing pressure and the differential value of the polishing rate.
Figure 7B:
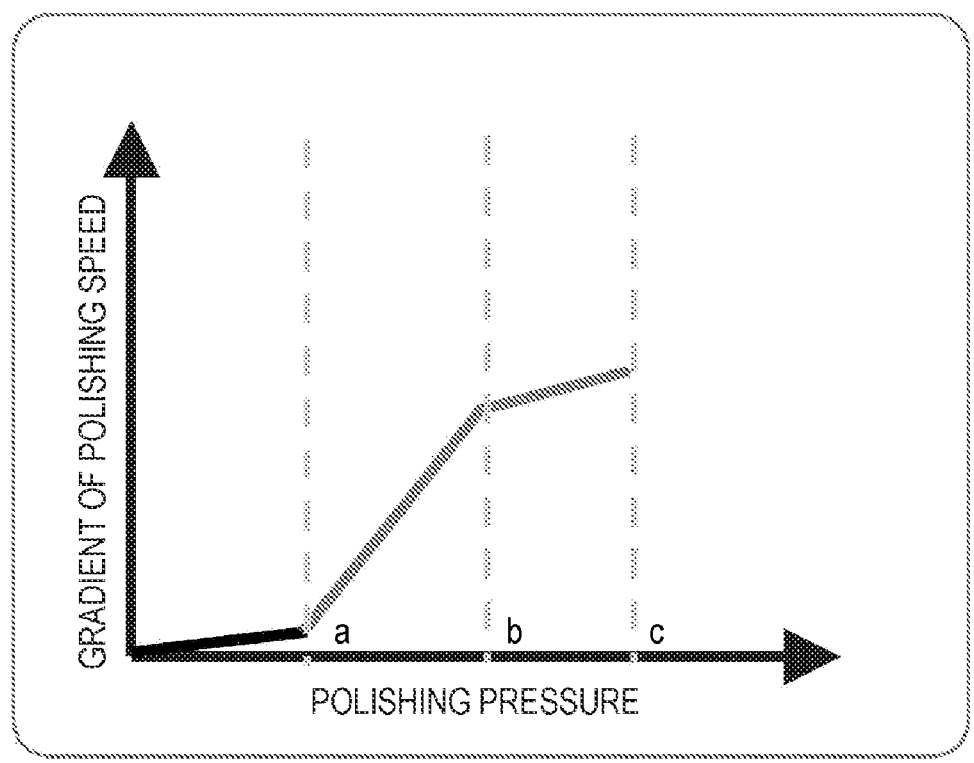

Furthermore, an actual amount of polishing (amount of scraping) of the second processed layer is obtained when planarization processing is performed on the second processed layer 14 formed on the various test circuit patterns 12 according to the CMP is obtained. Then, from the obtained amount of polishing, a relationship between the polishing pressure and a planarization rate (polishing rate) is obtained. This will be described later. FIGS. 7A and 7B show an example of a relationship between the polishing pressure and the planarization rate and an example of a relationship between the polishing pressure and the differential value of the planarization rate, respectively. In the examples shown in FIGS. 7A and 7B, the planarization rate (polishing rate) is not high in the region where polishing pressure is low and shows little change. Further, in the region where the polishing pressure is at the middle level, the planarization rate (polishing rate) abruptly increases. Furthermore, in the region where the polishing pressure is high, the planarization rate (polishing rate) is high and shows little change. In this manner, a third actual measurement database related to a relationship between the circuit pattern and the planarization rate of the second processed layer formed thereon, and further, a relationship between the polishing pressure and the planarization rate can be obtained. The relationships between the polishing pressure and the planarization rate varies depending on the CMP apparatus in use, the polishing agent in use, or the like. Therefore, when the CMP method is adopted for the planarization processing, the third actual measurement database is an actual measurement database with parameters of the CMP apparatus, the polishing agent, or the like. This database is for dealing with the temporal change of the device sectional structure, and may be classified according to polishing processes. The polishing processes include a metal removing process, seed metal removing process, barrier removing process, etc., for example.

Further, a reference film thickness $T_{blk}$ of the second processed layer formed on a region in which no circuit pattern exists (the region 10B of the test substrate 10 shown in FIG. 2B) is obtained in advance. The reference film thickness $T_{blk}$ varies depending on the manufacturing line of semiconductor devices, the formation condition of the second processed layer, or the like, however, it may be considered constant within one wafer. That is, also the reference film thickness $T_{blk}$ takes a value with parameters of the manufacturing line of semiconductor devices, formation condition of the second processed layer, or the like.

[Step-110]

In the film thickness prediction method of Example 1, the first processed layer to be formed on the substrate is segmented into grid-like meshes having a predetermined size. That is, the relationships between circuit patterns as targets and predetermined sizes of meshes are stored in the first actual measurement database, and thereby, the predetermined size of meshes can be obtained from the first actual measurement database by searching for design data of the circuit pattern as a target. Specifically, in Example 1, the circuit pattern design data is processed so that the first processed layer to be formed on the substrate may be segmented into grid-like meshes having a size of 100-μm-square across the entire chip surface based on the circuit pattern design data.

This operation or an operation as will be described below is performed using a film thickness prediction apparatus, specifically, a computer. A pattern area ratio $\alpha_{ij}$ occupied by the circuit pattern to be formed on the first processed layer is obtained in each mesh (i,j), and further, a circumferential length $L_{ij}$ of the circuit pattern in each mesh (i,j) is obtained. This operation is performed in all meshes. Note that the methods and operations for obtaining the pattern area ratio $\alpha_{ij}$ and the circumferential length $L_{ij}$ of the circuit pattern may be known methods and operations.

Figure 3B:
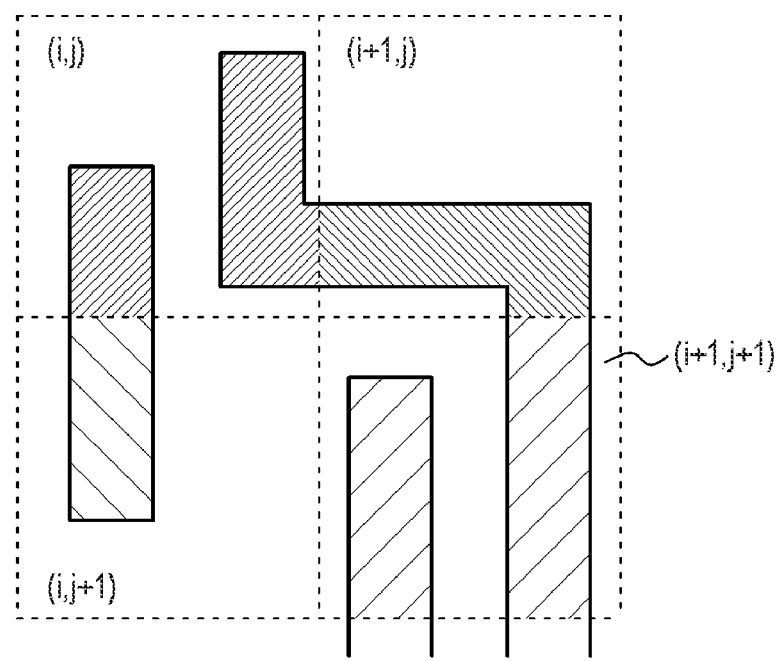

FIG. 3B schematically shows a circuit pattern that occupies mesh (i,j), mesh (i+1,j), mesh (i,j+1), mesh (i+1,j+1). The boundaries between meshes are shown by dotted lines. In the mesh (i,j), the pattern area ratio $\alpha_{ij}$ and the circumferential length $L_{ij}$ of the circuit pattern shown by the fine hatching from the upper right to the lower left are obtained. Further, in the mesh (i+1,j), the pattern area ratio $\alpha_{(i+1)j}$ and the circumferential length $L_{(i+1)j}$ of the circuit pattern shown by the fine hatching from the upper left to the lower right are obtained. Furthermore, in the mesh (i,j+1), the pattern area ratio $\alpha_{i(j+1)}$ and the circumferential length $L_{i(j+1)}$ of the circuit pattern shown by the rough hatching from the upper left to the lower right are obtained. Moreover, in the mesh (i+1,j+1), the pattern area ratio $\alpha_{(i+1)(j+1)}$ and the circumferential length $L_{(i+1)(j+1)}$ of the circuit pattern shown by the rough hatching from the upper right to the lower left are obtained. Note that, in the circuit pattern across the boundary between meshes, the length of the part of the circuit pattern on the boundary between meshes is included in the circumferential length.

[Step-120]

Then, an initial thickness (hump height) $T_{2\_INI\_ij}$ of the second processed layer in each mesh (i,j) is obtained from the circumferential length $L_{ij}$ of the circuit pattern based on the second actual measurement database. That is, the initial thickness (hump height) of the second processed layer corresponding to the circumferential length $L_{ij}$ of the circuit pattern is retrieved from the second actual measurement database, and the initial thickness (hump height) of the second processed layer retrieved from the second actual measurement database is used as the initial thickness (hump height) $T_{2\_INI\_ij}$ of the second processed layer in each mesh (i,j). This operation is performed in all meshes.

[Step-130]

Then, the film thickness of the second processed layer after planarization of the second processed layer is predicted from the initial film thickness predicted value $Pr_{ij}$ of the second processed layer in the mesh (i,j) obtained based on the pattern area ratio $\alpha_{ij}$ and the reference film thickness $T_{blk}$ of the second processed layer, the initial thickness $T_{2\_INI\_ij}$ of the second processed layer, and an amount of planarization $H_{ij}$ of the second processed layer in the mesh (i,j) obtained based on the first actual measurement database, the second actual measurement database, and the third actual measurement database. This operation is performed in all meshes.

Here, the initial film thickness predicted value $Pr_{ij}$ of the second processed layer can be obtained based on the reference film thickness $T_{blk}$ of the second processed layer, the pattern area ratio $\alpha_{ij}$, a thickness $T_{1\_INI\_ij}$ of the first processed layer in the mesh (i,j), and the circumferential length $L_{ij}$ of the circuit pattern. Further, the amount of planarization $H_{ij}$ of the second processed layer is obtained based on a relationship between the polishing pressure and the planarization rate according to the change in sectional structure of the second processed layer in the mesh (i,j) during the planarization processing of the second processed layer.

Specifically, the amount of planarization $H_{ij}$ of the second processed layer is obtained assuming that, in "condition-A" that the sectional structure of the second processed layer does not greatly change during the planarization processing of the second processed layer, the planarization rate is proportional to the amount of planarization work (amount of friction work) per unit area and time in "condition-A", and, the sectional structure of the second processed layer greatly changes and then turns into "condition-B" that the sectional structure of the second processed layer does not greatly change, the planarization rate is proportional to the amount of planarization work (amount of friction work) per unit area and time in "condition-B". More specifically, the initial film thickness predicted value $Pr_{ij}$ of the second processed layer is obtained by the following equation (1) and a film thickness $T_{2\_END\_ij}$ of the second processed layer at completion of the planarization processing when no second processed layer exists on the circuit pattern of the first processed layer is predicted by the following equation (2).

$$Pr_{ij} = (1-\alpha_{ij})T_{1\_INI\_ij} + T_{blk}(1+k_1 \cdot L_{ij})k_2 \cdot k_3 \qquad (1)$$

$$T_{2\_END\_ij} = Pr_{ij} - k_4 \cdot H_{ij} \qquad (2)$$

Here, the initial film thickness predicted value $Pr_{ij}$, $T_{2\_END\_ij}$ and $H_{ij}$ are values with reference to the top surface of the circuit pattern of the first processed layer, $k_1$ is a constant, $k_2$ is a coefficient according to the area of the circuit pattern, $k_3$ is a coefficient according to formation of the second processed layer, and $k_4$ is a coefficient according to planarization processing of the second processed layer.

The values of $Pr_{ij}$, $T_{1\_INI\_ij}$, $T_{blk}$, $H_{ij}$ are positive values.

Here, the equation (1) is based on an empirical rule obtained by conducting various tests. Note that the equation is based on the consideration of the reference film thickness $T_{blk}$ of the second processed layer, the pattern area ratio $\alpha_{ij}$, the initial thickness $T_{1\_INI\_ij}$ of the first processed layer in the mesh (i,j), and the circumferential length $L_{ij}$ of the circuit pattern as described above.

Further, the values of $k_1$, $k_2$, $k_3$, $k_4$ can be obtained together with the first actual measurement database, the second actual measurement database, and the third actual measurement database by using a test substrate provided with various test circuit patterns, forming the second processed layer on the various test circuit patterns, measuring the thickness of the formed second processed layer, and further performing planarization processing on the formed second processed layer. These values are stored in relation to the circuit pattern in the third actual measurement database, for example. Specifically, the constant $k_1$ and the coefficient $k_2$ according to the area of the circuit pattern can be determined based on the relationship between the circumferential length of the circuit pattern and the thickness of the second processed layer formed thereon (e.g., see FIG. 6) in the second actual measurement database. Furthermore, the coefficient $k_3$ according to formation of the second processed layer is specifically a coefficient for the plating film thickness with parameters that affect the plating film thickness. Regarding the $k_3$, for example, the parameters can be specified and the coefficient $k_3$ can be determined by conducting various experiments in which plating conditions such as kinds of plating liquids, current values, controls of plating liquid flows are varied. Furthermore, the coefficient $k_4$ according to planarization processing of the second processed layer is specifically a coefficient with parameters of CMP apparatus, polishing agent, and various kinds of polishing conditions in the CMP method. Regarding the $k_4$, the parameters can be specified and the coefficient $k_4$ can be determined by conducting various experiments in which CMP conditions etc. are varied.

Figure 12A:
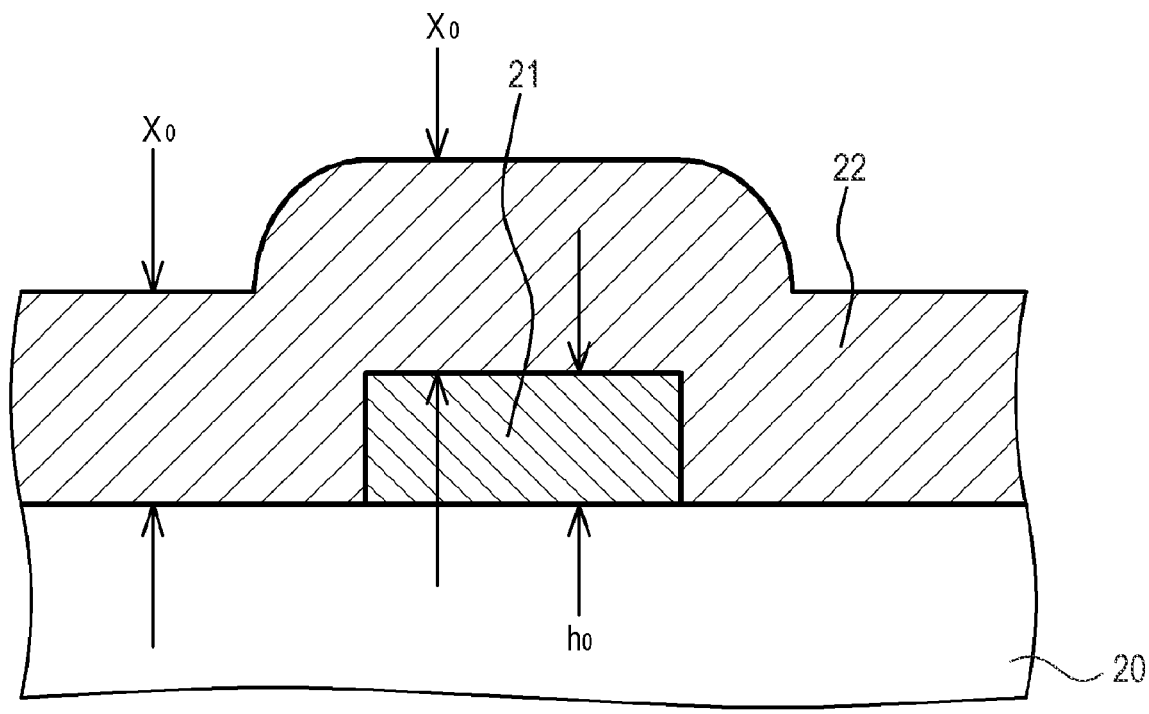
FIGS. 12A and 12B are conceptual diagrams of a state in which the second processed layer is polished by the chemical mechanical polishing method.
Figure 12B:
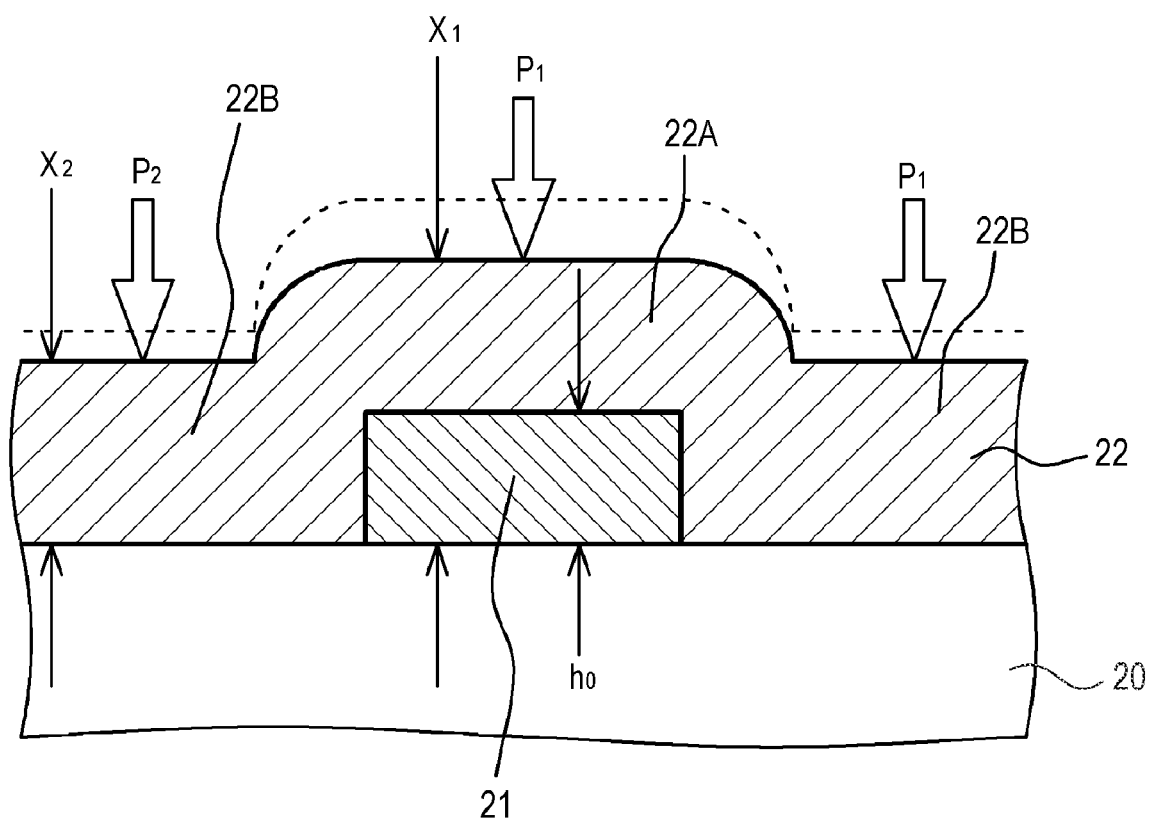

Now, as shown in FIG. 12A, it is assumed that a patterned first processed layer 21 (having a thickness of $h_0$) is formed on a foundation layer 20, and a second processed layer 22 having a thickness of $X_0$ is formed on the entire surface. The height of the surface of the second processed layer 22A on the first processed layer 21 is $(h_0 + X_0)$, and the height of the surface of the second processed layer 22B on the foundation layer 20 is $X_0$. Here, the reference of the height is the surface of the foundation layer 20 and the reference is common in the following description. Then, as shown in FIG. 12B, it is assumed that the second processed layer 22 is polished by polishing and the height of the surface of the second processed layer 22A on the first processed layer 21 is $X_1$, and the height of the surface of the second processed layer 22B on the foundation layer 20 is $X_2$. Further, it is assumed that pressure $P_1$ is applied to the second processed layer 22A and pressure $P_2$ is applied to the second processed layer 22B by the polishing pad in the polishing apparatus. Note that the pressure $P_1$ and $P_2$ are functions of polishing time t and supposed to be described as $P_1(t)$ and $P_2(t)$, however, they are noted as $P_1$ and $P_2$ for convenience.

Here, given that the area of the patterned first processed layer 21 is $S_1$, the part of the second processed layer 22 formed on the foundation layer 20 is $S_2$, and the average value of the pressure applied to the entire surface is P, the equation (B) is derived from the balance of forces. Further, the equation (C) is obtained by transformation of the equation (B).

$$S_1 \cdot P_1 + S_2 \cdot P_2 = (S_1 + S_2)P \qquad (B)$$

$$K \cdot P_1 + (1-K)P_2 = P \qquad (C)$$

In the equation (C), $K = S_1/(S_1+S_2)$. Here, the polishing pad is in contact with the second processed layer 22 across a considerable area of the second processed layer 22. Accordingly, the value of K can be replaced by a pattern area ratio average value $\beta_{ij}$ related to the mesh (i,j). Therefore, the equation (C) can be further transformed into the following equation (D). The pattern area ratio average value $\beta_{ij}$ within a predetermined region centered around the mesh (i,j) will be described later.

$$\beta_{ij} P_1 + (1-\beta_{ij})P_2 = P \qquad (D)$$

Here, given that the Young's modulus of the polishing pad is $E_{Pad}$ and the thickness is $T_{Pad}$, a relationship between $P_1$ and $P_2$ is expressed by the following equation (E)

$$P_1 - P_2 = (E_{Pad}/T_{Pad})(X_1 - X_2) \qquad (E)$$

Here, if the equation (A) is respectively applied to the polished remaining heights $X_1$ and $X_2$ of the second processed layer 22A on the first processed layer 21 and the second processed layer 22B on the foundation layer 20, the following equations (F-1) and (F-2) hold.

$$-dX_1/dt = c \cdot v \cdot P_1 \qquad (F-1)$$

$$-dX_2/dt = c \cdot v \cdot P_2 \qquad (F-2)$$

If $P_1$ and $P_2$ are obtained as functions of $X_1$ and $X_2$ from the equation (D) and the equation (E) and these $P_1$ and $P_2$ are substituted into the equations (F-1) and (F-2), then inhomogeneous simultaneous linear differential equations are obtained. By solving the inhomogeneous simultaneous linear differential equations, the following equations (G-1) and (G-2) are obtained.

$$X_1 = \\ X_0 + \beta_{ij} \cdot h_0 - c \cdot v \cdot P \cdot t + (1 - \beta_{ij})h_0 \cdot \exp[-(c \cdot v \cdot E_{Pad}/T_{Pad})t] \quad (G-1)$$

$$X_2 = X_0 + \beta_{ij} \cdot h_0 - c \cdot v \cdot P \cdot t - \beta_{ij} \cdot h_0 \cdot \exp[-(c \cdot v \cdot E_{Pad}/T_{Pad})t] \quad (G-2)$$

The average height $h_{ij}$ of the surface of the part of the second processed layer 22 corresponding to the mesh (i,j) from the surface of the foundation layer 20 is expressed by the following equation (H).

$$h_{ij} = \alpha_{ij} \cdot X_1 + (1 - \alpha_{ij})X_2 \quad (H)$$

From the equation (H) and equation (G-1), equation (G-2), the following equation (I) is obtained. Further, by transforming the equation (I), the equation (J) can be obtained.

$$h_{ij} = X_0 + \beta_{ij} \cdot h_0 - c \cdot v \cdot P \cdot t + (\alpha_{ij} - \beta_{ij})h_0 \cdot \exp[-(c \cdot v \cdot E_{Pad}/T_{Pad})t] \quad (I)$$

$$h_{ij} = X_0 - c \cdot v \cdot P \cdot t + \alpha_{ij} \cdot h_0 \cdot \exp[-(c \cdot v \cdot E_{Pad}/T_{Pad})t] + \\ \beta_{ij} \cdot h_0 \cdot (1 - \exp[-(c \cdot v \cdot E_{Pad}/T_{Pad})t]) \quad (J)$$

$h_{ij\_START}$ at the time (t=0) when the polishing of the second processed layer 22 is started is expressed by the following equation (K-1) from the equation (J). On the other hand, the value of $h_{ij\_END}$ at the time (t=t') of the H(i,j) when the polishing of the second processed layer 22 is completed is expressed by the following equation (K-2) from the equation (J).

$$h_{ij\_START} = X_0 + \alpha_{ij} \cdot h_0 \quad (K-1)$$

$$h_{ij\_END} \approx X_0 c \cdot v \cdot P \cdot t' + \beta_{ij} \cdot h_0 \quad (K-2)$$

From the equation (K-1) and equation (K-2), it is known that the $h_{ij\_END}$ of the surface of the second processed layer 22 at the time when the polishing of the second processed layer 22 is completed depends on the pattern area ration average value β(i,j).

Here, the pattern area ratio average value $\beta_{ij}$ can be obtained with the following equation (L-1) and equation (L-2). The value of Q in the equation (L-1) may be any value equal to or more than zero, and is preferably a value of about nine. Further, the value of m may be any value equal to or more than one, and, if Q=9, for example, preferably m=10. As shown in the equation (L-1), the value of the $\alpha_{q+1}(i,j)$ is smoothed (planarization processed), and thereby, the more correct value of $\beta_{ij}$ can be obtained. Note that, q=0, 1, 2 . . . Q, and, if q=0, $\alpha_0(i+p, j+r) = \alpha(i+p, j+r)$.

$$\alpha_{q+1}(i,j) = \Sigma_p \Sigma_r \alpha_q(i+p, j+r)/(2m+1)^2 \quad (L-1)$$

$$\beta_{ij} = \alpha_{Q+1}(i,j) \quad (L-2)$$

Here, the sign "$\Sigma_p$" means calculation of a sum from −m to +m with respect to "p", and the sign "$\Sigma_r$" means calculation of a sum from −m to +m with respect to "r".

In Example 1, ten is employed as the value of m in the equation (L-1) and nine is employed as the value of Q. That is, the pattern area ratio average value $\beta_{ij}$ is obtained as an average value of pattern area ratios within 2100 μm×2100 μm around the mesh (i,j). Further, smoothing (planarization processing) of the value of $\alpha_{q+1}(i,j)$ is performed at ten times.

Here, the above mentioned equation (J), equation (K-1), equation (K-2) are based on the assumption that, when the planarization processing is performed on the second processed layer according to the CMP method, the polishing pressure and the planarization rate (polishing rate) do not change. There is a system in which that assumption holds, however, in Example 1, a system in which, when the planarization processing is performed on the second processed layer according to the CMP method, the polishing pressure and the planarization rate (polishing rate) do change is assumed. That is, when the polishing of the second processed layer is started, the part having a thicker film thickness of the second processed layer on the circuit pattern formed on the first processed layer is first polished (e.g., see the part shown by an outline arrow in FIG. 4B). Then, when the polishing progresses and the sectional structure (sectional profile) of the polished second processed layer changes, the polishing pressure changes and the planarization rate changes as shown in FIGS. 7A and 7B. Accordingly, the polishing pressure and the planarization rate change at each time when the sectional structure of the polished second processed layer changes or at fixed time intervals.

In Example 1, as described above, the first actual measurement database, the second actual measurement database, and the third actual measurement database are obtained by using a test substrate provided with various test circuit patterns, forming the second processed layer on the various test circuit patterns, measuring the thickness of the formed second processed layer, and further performing planarization processing on the formed second processed layer, and concurrently, amounts of polishing in the second processed layer formed on the various test circuit patterns are obtained in the respective polishing stages together as described above.

Figure 8:
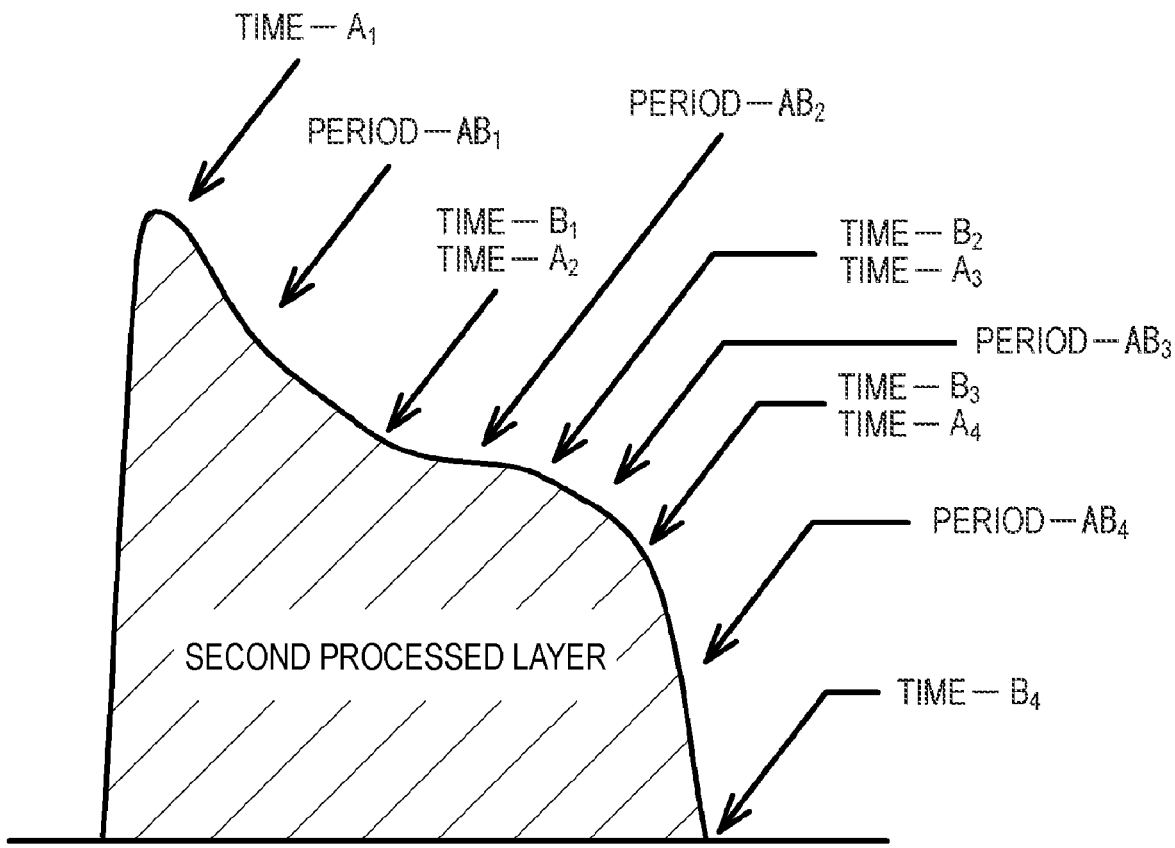
FIG. 8 is a schematic sectional view of the second processed layer for explanation of conditions in changes of the sectional structure (device sectional structure, sectional profile) of the second processed layer.

Here, a planarization situation that the sectional structure of the polished second processed layer greatly changes, the second processed layer is continued to be polished, and the sectional structure of the polished second processed layer greatly changes again is assumed. Here, first, for example, the time when the sectional structure of the polished second processed layer greatly changes and then the change of the sectional structure of the polished second processed layer becomes smaller is referred to as "time-A", after the time when the change of the sectional structure of the polished second processed layer is smaller, the time when the sectional structure of the polished second processed layer turns to greatly change is referred to as "time-B", and the period between the time-A and the time-B is referred to as "period-AB". If a series of period from the time-A via the period-AB to the time-B is referred to as "planarization processing period", there are at least two planarization processing periods from start to end of the planarization processing of the second processed layer. FIG. 8 is a schematic sectional view of the second processed layer. In the shown example, there are four planarization processing periods. The first planarization processing period includes time-$A_1$, period-$AB_1$, and time $B_1$, the second planarization processing period includes time-$A_2$, period-$AB_2$, and time $B_2$, the third planarization processing period includes time-$A_3$, period-$AB_3$, and time $B_3$, and the fourth planarization processing period includes time-$A_4$, period-$AB_4$, and time $B_4$.

Further, in the respective planarization processing periods, values $h_{ij-A}$, $h_{ij-B}$ of $h_{ij}$ at the time-A and time-B are obtained from actual measurement values of amounts of polishing $X_{1-A}$, $X_{2-A}$ of $X_1$, $X_2$ at the time-A and actual measurement values of amounts of polishing $X_{1-B}$, $X_{2-B}$ of $X_1$, $X_2$ at the time-B according to the equation (H).

$$h_{ij-A} = \alpha_{ij-AB} \cdot X_{1-A} + (1 - \alpha_{ij-AB})X_{2-A} \quad (H-1)$$

$$h_{ij-B} = \alpha_{ij-AB} \cdot X_{1-B} + (1 - \alpha_{ij-AB})X_{2-B} \quad (H-2)$$

In place of the pattern area ratio $\alpha_{ij}$ in the equation (H), the pattern area ratio $\alpha_{ij\_AB}$ is used in the equation (H-1) and equation (H-2). The pattern area ratio $\alpha_{ij\_AB}$ is an area ratio correction value based on the sectional structure of the second processed layer obtained from the first actual measurement database, and a correction value $\Delta\alpha_{ij}$ in the period-AB is added thereto. That is, the equation (H-1) and equation (H-2) basically obey the Preston's equation in which the planarization rate of the second processed layer in the mesh (i,j) is proportional to the amount of planarization work (amount of friction work) per unit area and time, and the change of the sectional structure of the second processed layer in the mesh (i,j) during the planarization processing of the second processed layer is added as a term of $\alpha_{ij\_AB}$. Further, the values of $X_{1-A}$, $X_{2-A}$ at the start of planarization processing are as follows:

$X_{1-A} = T_{2\_INI\_ij}$; and $X_{2-A} = T_{blk}$.

The ratio of the area of the second processed layer to the area of the mesh when the second processed layer is cut along a virtual plane in parallel with the foundation layer is referred to as "area density of the second processed layer". Further, the amount of change of the area density of the second processed layer per unit thickness of the second processed layer is referred to as "differential value of the area density of the second processed layer". Generally, planarization progresses faster in the mesh (i,j) in which the film thickness of the second processed layer is thicker and/or in the mesh (i,j) in which the differential value (change rate) of the area density of the second processed layer is large. Here, $h_{ij-A}$, $h_{ij-B}$ are obtained form the equation (H-1) and equation (H-2) based on the film thicknesses $X_{1-A}$, $X_{1-B}$, $X_{2-A}$, $X_{2-B}$ and $\alpha_{ij\_AB}$, and thereby, the planarization processing model in which planarization progresses faster is embodied in the mesh (i,j) in which the film thickness of the second processed layer is thicker and/or in the mesh (i,j) in which the differential value of the area density of the second processed layer is large.

By substituting the value of $h_{ij-B}$ in the equation (H-2) into the left side of the equation (K-2) and the value of $h_{ij-A}$ in the equation (H-1) into $X_0$ at the right side of the equation (K-2), the average value P of the pressure applied to the entire surface can be obtained because the c, v, t' (time length of the period-AB), $\beta_{ij}$, $h_0$ are known values. Further, at the same time, the planarization rate (polishing rate) in the period-AB can be obtained from the values of $h_{ij-A}$, $h_{ij-B}$, t' (time length of the period-AB). In this manner, the relationship between the average value P of the pressure and the planarization rate Rt from the start to end of the planarization processing of the second processed layer with the parameter of the sectional structure of the second processed layer can be obtained. Thus obtained relationship between the average value P of the pressure and the planarization rate Rt from the start to end of the planarization processing of the second processed layer is stored in the third actual measurement database.

Further, the following processing, operation will be performed using a film thickness prediction apparatus, specifically, a computer. That is, in each mesh (i,j), the area density of the second processed layer and the differential value of the area density of the second processed layer for the time from the start of the planarization processing are calculated by referring to the first actual measurement database. Then, to which the planarization processing period belongs is determined based on the obtained calculation result, the planarization rate Rt is obtained by referring to the third actual measurement database from the pressure average value P in the planarization processing period obtained by referring to the third actual measurement database, and the amount of polishing is calculated from the planarization rate Rt and the polishing time. Then, this operation is repeated until the area density of the second processed layer no longer changes. Then, at the time when there is no change in the area density of the second processed layer, the obtained amount of polishing is subtracted from the thickness $T_{1\_INI\_ij}$ of the first processed layer, and thereby, the amount of planarization $H_{ij}$ of the second processed layer in the mesh (i,j) can be obtained. Further, from the equation (1) and equation (2), the film thickness $T_{2\_END\_ij}$ of the second processed layer at completion of the planarization processing when no second processed layer exists on the circuit pattern of the first processed layer can be predicted. Furthermore, those operations are performed in all meshes.

In Example 1, $k_1 = 94.0$ $k_2 = 1.1$ $k_3 = 121.37$ $k_4 = 1.1$.

Figure 9:
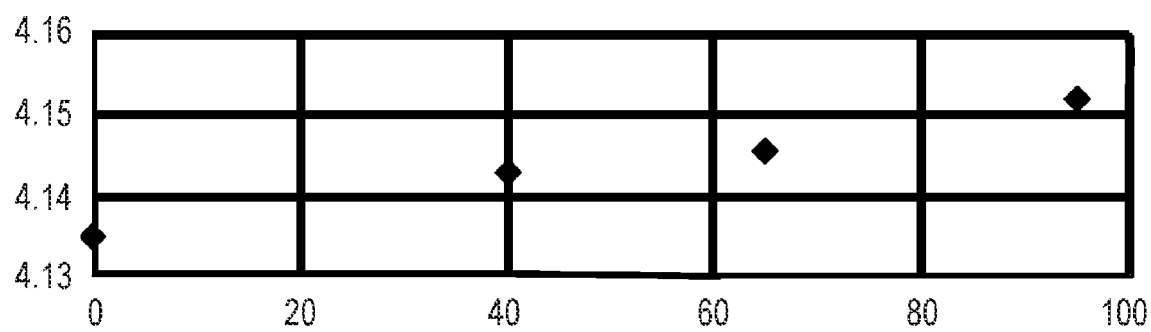
FIG. 9 is a graph showing a relationship between the film thickness of the second processed layer obtained by actually forming the first processed layer and the second processed layer and performing planarization processing on the second processed layer by the CMP method (vertical axis) and the film thickness of the second processed layer predicted by the film thickness prediction method of Example 1 (horizontal axis).

FIG. 9 shows a relationship between the film thickness of the second processed layer obtained by actually forming the first processed layer and the second processed layer and performing planarization processing on the second processed layer by the CMP method (vertical axis in FIG. 9) and the film thickness of the second processed layer predicted by the film thickness prediction method of Example 1 (horizontal axis in FIG. 9). Both the vertical axis and the horizontal axis indicate relative numeric values. From FIG. 9, a good correlation is recognized between the actual film thickness of the second processed layer and the film thickness of the second processed layer predicted according to the film thickness prediction method of Example 1. That is, it is known that, according to the method of Example 1, the film thickness of the second processed layer (the film thickness of the second processed layer in the region where no circuit pattern of the first processed layer is formed) can be correctly predicted.

Depending on the situation, when the circumferential length $L_{ij}$ of the circuit pattern in the mesh (i,j) is obtained, averaging processing of the circumferential length may be performed in the edge part of the circuit pattern. Thereby, the initial thickness $T_{2\_INI\_ij}$ of the second processed layer in the mesh (i,j) can be obtained based on the circumferential length $L_{ij}$ of the circuit pattern. This technique is effective when the amount of polishing is proportional to pressure, that is, the amount of polishing obeys the Preston's equation.

Specifically, for example, a mesh $(i',j')_{ij}$ for averaging processing of the circumferential length is assumed by segmenting one mesh (i,j). Then, in the edge part of the circuit pattern, a certain mesh $(i',j')_{ij}$ for averaging processing is centered and the circumferential lengths of the nine meshes of eight meshes $(i'-1,j'-1)_{ij}$, $(i'-1,j')_{ij}$, $(i'-1,j'+1)_{ij}$, $(i',j'-1)_{ij}$, $(i'+1,j')_{ij}$, $(i'+1,j'-1)_{ij}$, $(i',j'+1)_{ij}$, $(i'+1,j'+1)_{ij}$ for averaging processing surrounding the mesh $(i',j')_{ij}$ for averaging processing and $(i',j')_{ij}$ are averaged, and the obtained circumferential length average value is used as the circumferential length $L_{ij}(i',j')$ of the circuit pattern of the mesh $(i',j')_{ij}$ for averaging processing. Then, by adding a sum of these circumferential lengths $L_{ij}(i',j')$ of the circuit pattern, the circumferential length $L_{ij}$ of the circuit pattern in the mesh (i,j) may be obtained. In Example 1, as shown in FIG. 4B, the film thickness of the second processed layer largely varies in the region at a distance of about 0.4 μm or more apart from the edge part of the test circuit pattern. Therefore, the size of the mesh $(i',j')_{ij}$ for averaging processing is set to 0.1 μm.

EXAMPLE 2

Example 2 relates to a layout design method according to the first embodiment of the invention. That is, the method is a layout design method of designing a layout of a semiconductor circuit based on semiconductor integrated circuit design data.

In Example 2, first, a circuit pattern is formed on a first processed layer formed on a substrate, then a second processed layer is formed on an entire surface, and a film thickness of the second processed layer after planarization of the second processed layer is predicted according to the film thickness prediction method of the embodiment of the invention (specifically, the film thickness prediction method described in Example 1). Then, the prediction result of the film thickness of the second processed layer is input to a technology file for RC extraction, and thereby, higher accuracy of RC extraction is realized.

Typically, information on a device sectional structure is input to a technology file for RC extraction. Here, the information on the device sectional structure necessary for input includes thicknesses and dielectric constants of a wiring layer of a conductive material and an interlayer insulating layer forming a semiconductor device, for example. Further, generally, for RC extraction, not only a center condition file but also plural condition files of the best condition, the worst condition, etc. are prepared. The delay of the circuit is often affected by capacitance. Especially, in the 65-nm-node or lower device generations, it is said that the cell delay is dominant relative to the stage delay. Therefore, the technology file for RC extraction is created according to the device structure in the worst condition of capacitance, i.e., the minute device structure. Accordingly, the thickness of the region having the area ratio of 50% in the circuit layout (minute layout) are calculated with respect to each layer and this is used as the film thickness value of the center condition.

Furthermore, the technology file is created by predicting the film thicknesses of the second processed layer for circuit patterns of various pattern area ratios, and obtaining the minimum value and the maximum value of the predicted film thicknesses. Regarding input of the minimum value and the maximum value, a combination that maximizes the capacitance under the capacitance worst condition, i.e., the maximum film thickness of the wiring layer and the minimum film thickness of the interlayer insulating layer are input. For the best condition, the opposite combination is input. Further, regarding the device structure, the resistance value of the wiring layer is calculated and input to the technology file.

Then, capacitance extraction is performed based on the predicted film thickness of the second processed layer, delay calculation or timing analysis, or delay calculation and timing analysis are performed. Specifically, RC extraction is performed using the created technology file. As a result, in comparison between RC products, a difference of about 20% can be confirmed compared to the technique in related art.

Figure 10:
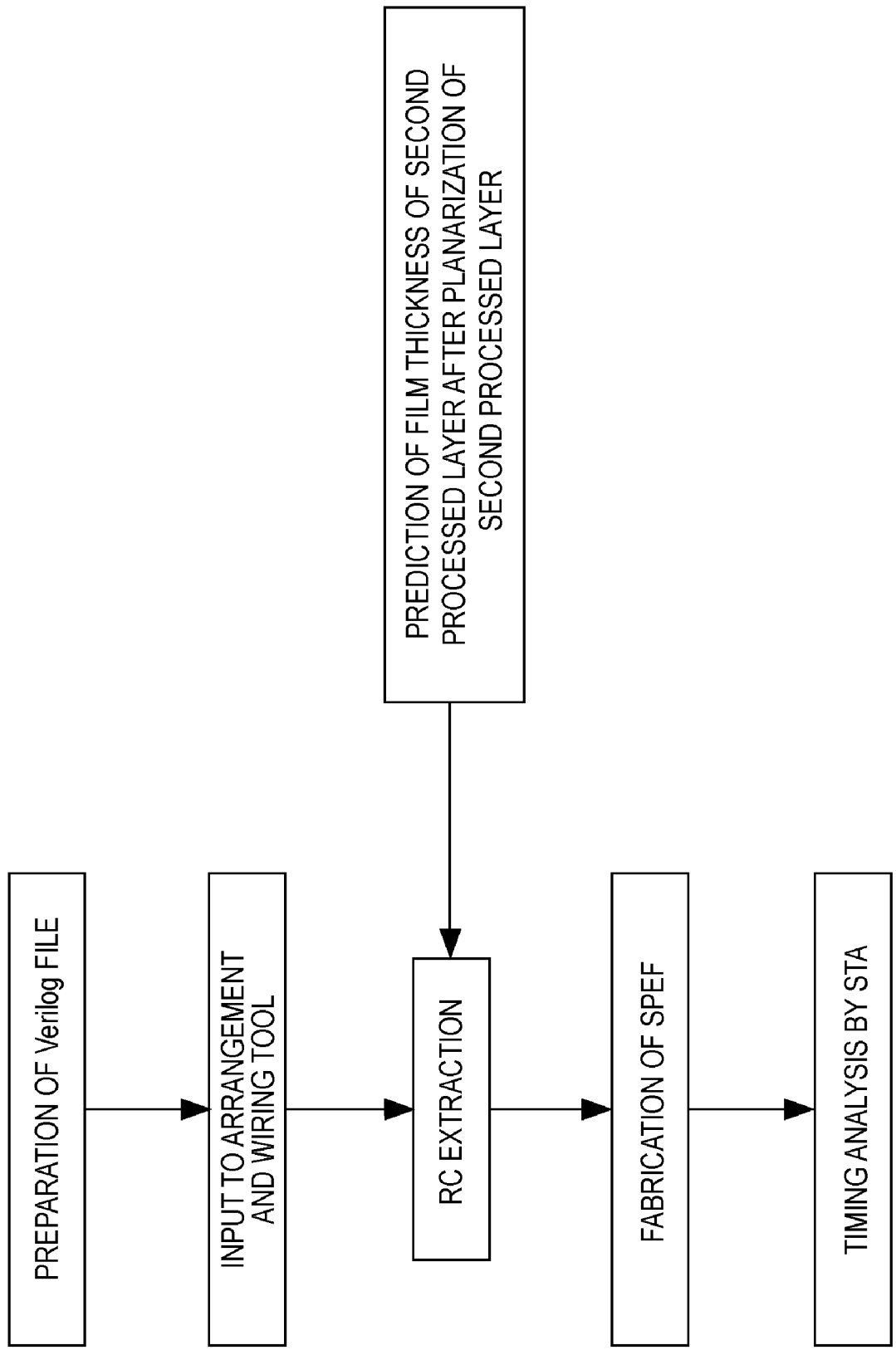
FIG. 10 is a flowchart of delay calculation in a layout design method of Example 2.

Then, delay calculation at the chip level is performed using the created technology file. FIG. 10 is a flowchart of the delay calculation.

In the delay calculation, a very log file as connection information of a semiconductor device to be processed is prepared ([Step-200]) and input to an arrangement and wiring tool ([Step-210]). Then, the circuit layout data after arrangement and wiring is input and the RC extraction is performed using the above described technology file ([Step-220]). Then, a net list with capacitance load created as a result of RC extraction (SPEF, [Step-230]) is input to a timing analysis (STA) tool, and timing analysis is performed [Step-240]).

In Example 2, the maximum value and the minimum value are obtained including the film thicknesses of the circuit layouts having different pattern area ratios based on the film thicknesses of the wiring layer and the interlayer insulating layer input to the technology file, however, not limited to the method, for example, a method of obtaining the maximum value and the minimum value of film thicknesses with a fixed pattern area ratio, or otherwise, performing film thickness prediction calculation on the entire surface of the chip and obtaining the maximum value and the minimum value may be adopted.

Further, the technology file is not limited to those of the best condition and the worst condition. Furthermore, regarding the structure of the worst condition, not limited to the case where the capacitance is the worst, but the structure may be appropriately set according to the circuit layout to be processed. In a circuit layout with many wirings having long wiring lengths, the case where the capacitance is the worst is not necessarily the case where the delay is the worst. In this case, the structure having the maximum RC product may be the worst in delay. It is preferable that the determination of the worst structure is set according to the wiring length distribution by checking the wiring length distribution of the circuit layout in advance.

EXAMPLE 3

Example 3 relates to a layout design method according to the second embodiment of the invention and a layout design method of designing a layout of a semiconductor circuit based on semiconductor integrated circuit design data. Further, Example 3 also relates to a mask pattern design method of exposure mask and a fabrication method of semiconductor integrated circuit according to an embodiment of the invention.

In Example 3, first, a circuit pattern is formed on a first processed layer formed on a substrate, then a second processed layer is formed on an entire surface, and a film thickness of the second processed layer after planarization of the second processed layer is predicted according to the film thickness prediction method of the embodiment of the invention (specifically, the film thickness prediction method described in Example 1).

Then, in the layout design method of Example 3, a dummy pattern is provided on the first processed layer so that the predicted film thickness of the second processed layer may fall within a desired film thickness range.

Specifically, in Example 3, first, a first processed layer to be formed on the substrate is segmented into grid-like meshes having a predetermined size in the same manner as at the step of [Step-110] of Example 1. Then, a pattern area ratio $\alpha_{ij}$ in each mesh (i,j) is obtained. Then, the same steps as [Step-120] to [Step-130] of Example 1 are executed and the film thickness of the second processed layer is predicted.

Then, in each mesh (i,j), whether the predicted film thickness of the second processed layer falls within a desired film thickness range or not is checked. If the predicted film thickness of the second processed layer does not fall within the desired film thickness range, the dummy pattern is provided on the mesh. The size and shape of the dummy pattern can be optimized at the calculation for prediction of the film thickness of the second processed layer. The optimized dummy pattern may be unified (that is, the pattern may have the same shape and size), and varied with respect to each location of arrangement. Note that, the dummy pattern is not provided in a prohibited region where providing the dummy pattern is prohibited. Then, [Step-110] to [Step-130] of Example 1 are executed again, and, in each mesh (i,j), whether the predicted film thickness of the second processed layer falls within the desired film thickness range or not is checked. Such operations are repeated until the predicted film thickness of the second processed layer falls within the desired film thickness range, and further, the operations are executed in all meshes.

Figure 11:
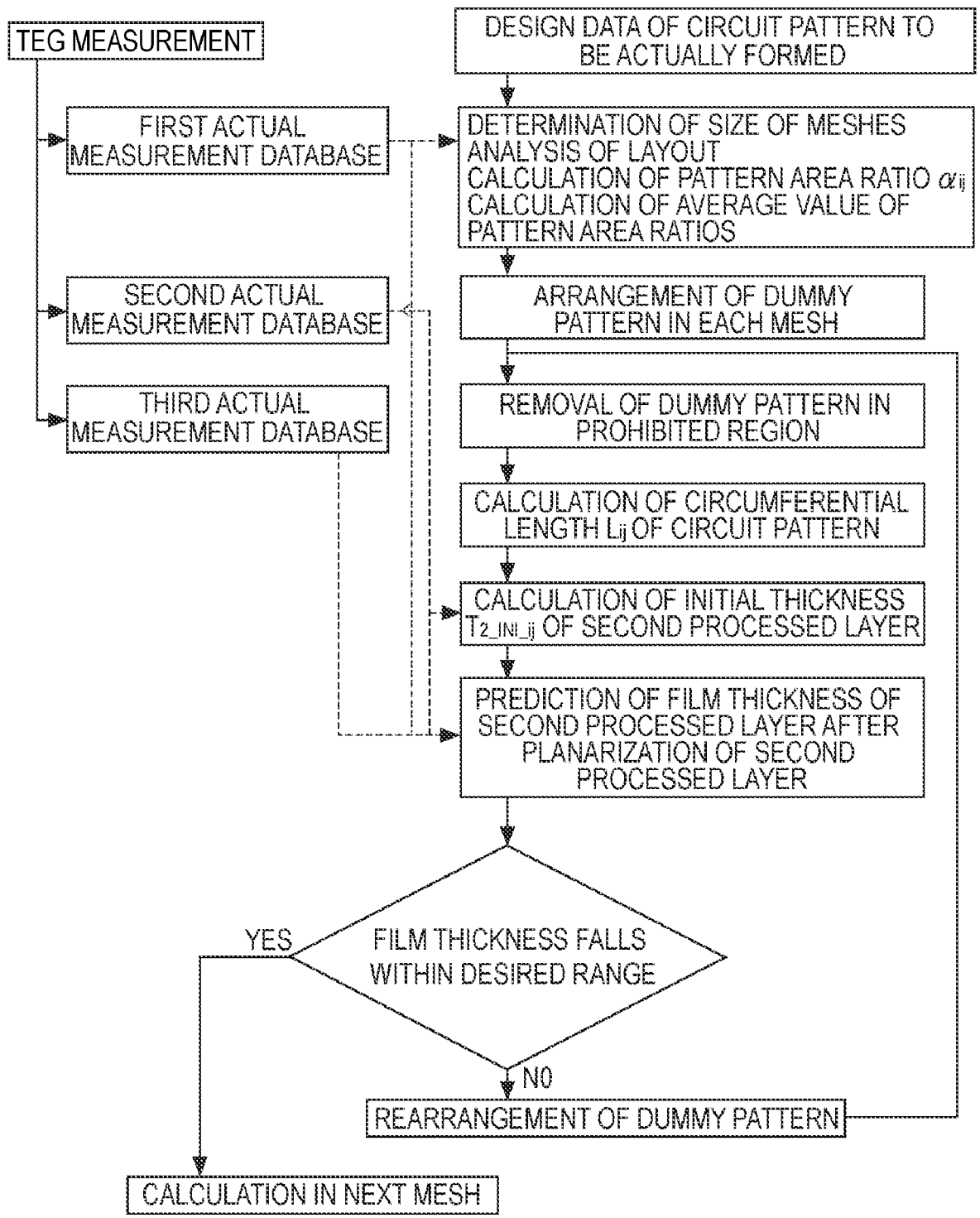
FIG. 11 is a flowchart of a modified example of a layout design method in Example 3.

Note that, as shown in the flowchart of FIG. 11, first, the same step as [Step-110] of Example 1 is executed, and the following operations may be added before the same steps as [Step-120] to [Step-130] of Example 1 are executed. That is, an average value of pattern area ratios $\alpha_{ij}$ is obtained and further, the shape of the dummy pattern is calculated and provided in each mesh so that the standard deviation of the pattern area ratios $\alpha_{ij}$ may be the minimum. Then, the dummy patterns in the prohibited regions where providing the dummy pattern is prohibited are removed. Then, the above described operations that the same steps as [Step-120] to [Step-130] of Example 1 are executed and whether the predicted film thickness of the second processed layer falls within the desired film thickness range or not is checked in each mesh (i,j) are performed.

In this way, the operations for all meshes are ended, and the second processed layer is considered as a new first processed layer and the same operations are performed on a new second processed layer thereon.

On the other hand, in the mask pattern design method of exposure mask of Example 3, the layout of the semiconductor circuit is designed according to the above described layout design method of providing the dummy pattern on the first processed layer so that the predicted film thickness of the second processed layer may fall within the predicted film thickness range, and a mask pattern of an exposure mask for circuit pattern formation on the first processed layer is designed based on the layout design of the semiconductor circuit according to a known method.

Furthermore, in the manufacturing method of semiconductor device of Example 3, the layout of the semiconductor circuit is designed according to the above described layout design method of providing the dummy pattern on the first processed layer so that the predicted film thickness of the second processed layer may fall within the predicted film thickness range, a mask pattern of an exposure mask for circuit pattern formation on the first processed layer is designed based on the layout design of the semiconductor circuit, more specifically, based on the circuit design (layout design) of the semiconductor circuit according to a known method, an exposure mask is fabricated according to a known method, and further, using the exposure mask, the circuit pattern is formed on the first processed layer based on a photolithography technology according to a known method.

So far, the embodiments of the invention have been explained according to the preferred examples, however, the embodiments of the invention are not limited to the examples. The test circuit patterns used in the examples are illustrative only and any test circuit pattern may be used as long as the relationship between the circumferential length of the circuit pattern and the film thickness of the second processed layer formed thereon can be investigated. Further, the relationship between the polishing pressure and the planarization rate (polishing rate) is not limited to the shown example. The relationships between the polishing pressure and the planarization rate (polishing rate) are stored in various forms of table, graph, numerals, or the like in the third actual measurement database. Furthermore, any means may be used for the film thickness calculation of the second processed layer during planarization processing as long as the planarization rate (polishing rate) can be predicted according to the shape of the polished second processed layer after planarization. It is also obvious that experimental conditions (test circuit pattern, formation condition of the second processed layer, etc.) may be set to various conditions according to the specifications of the semiconductor device.

When the second processed layer is formed by plating, the definition of the height of the plated film thickness (e.g., hump height), the distance affecting the plated thickness that has been described referring to the arrow X in FIG. 4B, etc. may be appropriately set according to the formation processes of the circuit pattern and the second processed layer. Further, the second processed layer has been formed by a Cu layer in the examples, however, the material forming the second processed layer is not limited to Cu but may be formed by an insulating layer or a tungsten layer, for example.

In addition, in the examples, the second processed layer has been predicted, however, the film thickness prediction method according to the embodiments of the invention may be applied to a method of using the second processed layer for which the film thickness prediction calculation is finished as the first processed layer and predicting a film thickness of a new second processed layer formed thereon, and further, to a method of predicting the respective film thicknesses of the multilayer film. One of planarization processing methods is an electrolytic polishing method. This method is oxidization of Cu according to the electrolytic method, and the point that an oxide layer is formed on the Cu surface and the oxide layer is mechanically removed is common to the method and the CMP method, and the film thickness prediction method according to the embodiments of the invention may be applied thereto.

Here, a film thickness prediction apparatus for executing the film thickness prediction method according to the embodiments of the invention is a film thickness prediction apparatus for forming a circuit pattern on a first processed layer formed on a substrate, then forming a second processed layer on an entire surface, and predicting a film thickness of the second processed layer after planarization of the second processed layer, including:

(a) a database creating unit that creates, based on data obtained by using a test substrate provided with various test circuit patterns, forming a second processed layer on the various test circuit patterns, measuring a thickness of the formed second processed layer, and further performing planarization processing on the formed second processed layer, (1) a first actual measurement database related to a relationship between the circuit pattern and a sectional structure (device sectional structure) of the second processed layer formed thereon, (2) a second actual measurement database related to a relationship between a circumferential length of the circuit pattern and the thickness of the second processed layer formed thereon, and (3) a third actual measurement database related to a relationship between the circuit pattern and a planarization rate of the second processed layer formed thereon;

(b) a layout analyzing unit that analyzes a layout of the circuit pattern (semiconductor circuit) by referring to the first actual measurement database;

(c) a model input unit that inputs a planarization processing model for the second processed layer;

(d) a parameter determining unit that determines a parameter of the planarization processing model using information of the second actual measurement database and a result of layout analysis; and (e) a film thickness predicting unit that predicts the film thickness of the second processed layer using the planarization processing model.

Further, a layout design apparatus for executing the layout design method according to the first embodiment of the invention is a layout design apparatus of designing a layout of a semiconductor circuit based on semiconductor integrated circuit design data, including:

(a) a database creating unit that creates, based on data obtained using a test substrate provided with various test circuit patterns, forming a second processed layer on the various test circuit patterns, measuring a thickness of the formed second processed layer, and further performing planarization processing on the formed second processed layer, (1) a first actual measurement database related to a relationship between the circuit pattern and a sectional structure (device sectional structure) of the second processed layer formed thereon, (2) a second actual measurement database related to a relationship between a circumferential length of the circuit pattern and the thickness of the second processed layer formed thereon, and (3) a third actual measurement database related to a relationship between the circuit pattern and a planarization rate of the second processed layer formed thereon;

(b) a layout analyzing unit that analyzes a layout of the circuit pattern (semiconductor circuit) by referring to the first actual measurement database;

(c) a model input unit that inputs a planarization processing model for the second processed layer;

(d) a parameter determining unit that determines a parameter of the planarization processing model using information of the second actual measurement database and a result of layout analysis;

(e) a film thickness predicting unit that predicts the film thickness of the second processed layer using the planarization processing model;

(f) a capacitance extracting unit that performs capacitance extraction using a prediction result of the film thickness of the second processed layer;

(g) a delay calculating unit that performs delay calculation using the extracted capacitance; and (h) a timing analyzing unit that performs timing analysis using a result of delay calculation.

Furthermore, a layout design apparatus for executing the layout design method according to the second embodiment of the invention is a layout design apparatus of designing a layout of a semiconductor circuit based on semiconductor integrated circuit design data, including:

(a) a database creating unit that creates, based on data obtained using a test substrate provided with various test circuit patterns, forming a second processed layer on the various test circuit patterns, measuring a thickness of the formed second processed layer, and further performing planarization processing on the formed second processed layer, (1) a first actual measurement database related to a relationship between the circuit pattern and a sectional structure (device structure) of the second processed layer formed thereon, (2) a second actual measurement database related to a relationship between a circumferential length of the circuit pattern and the thickness of the second processed layer formed thereon, and (3) a third actual measurement database related to a relationship between the circuit pattern and a planarization rate of the second processed layer formed thereon;

(b) a layout analyzing unit that analyzes a layout of the circuit pattern (semiconductor circuit) by referring to the first actual measurement database;

(c) a model input unit that inputs a planarization processing model for the second processed layer;

(d) a parameter determining unit that determines a parameter of the planarization processing model using information of the second actual measurement database and a result of layout analysis;

(e) a film thickness predicting unit that predicts the film thickness of the second processed layer using the planarization processing model; and (f) a dummy pattern generating unit that generates a dummy pattern based on a prediction result of the film thickness of the second processed layer.

Moreover, a mask pattern design apparatus for executing the mask pattern design method of the embodiment of the invention is a mask pattern design apparatus, when a pattern is formed on a first processed layer formed on a substrate, then a second processed layer is formed on an entire surface, and the second processed layer is planarized and a semiconductor integrated circuit is fabricated, of designing a mask pattern to be formed on an exposure mask used for the pattern formation, including:

(a) a database creating unit that creates, based on data obtained using a test substrate provided with various test circuit patterns, forming a second processed layer on the various test circuit patterns, measuring a thickness of the formed second processed layer, and further performing planarization processing on the formed second processed layer, (1) a first actual measurement database related to a relationship between the circuit pattern and a sectional structure (device structure) of the second processed layer formed thereon, (2) a second actual measurement database related to a relationship between a circumferential length of the circuit pattern and the thickness of the second processed layer formed thereon, and (3) a third actual measurement database related to a relationship between the circuit pattern and a planarization rate of the second processed layer formed thereon;

(b) a layout analyzing unit that analyzes a layout of the circuit pattern (semiconductor circuit) by referring to the first actual measurement database;

(c) a model input unit that inputs a planarization processing model for the second processed layer;

(d) a parameter determining unit that determines a parameter of the planarization processing model using information of the second actual measurement database and a result of layout analysis;

(e) a film thickness predicting unit that predicts the film thickness of the second processed layer using the planarization processing model;

(f) a dummy pattern generating unit that generates a dummy pattern based on a prediction result of the film thickness of the second processed layer; and (g) a mask data creating unit that creates mask data for the circuit pattern containing the dummy pattern.

The layout design methods of the embodiments of the invention are mainly realized as pattern design programs executed by a computer such as a work station, and can be stored and distributed in predetermined media (CD-ROM, DVD-ROM, or the like) or delivered via networks. Further, the above described film thickness prediction apparatus, layout design apparatus, mask pattern design apparatus are mainly embodied by a computer such as a work station.

The present application contains subject matter related to that disclosed in Japanese Priority Patent Application JP 2008-204335 filed in the Japan Patent Office on Aug. 7, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A film thickness prediction method of predicting a film thickness of a second processed layer after planarization when a circuit pattern is formed on a first processed layer formed on a substrate, a second processed layer is formed on an entire surface, and the second processed layer is planarized, comprising the steps of:
   by using a test substrate provided with various test circuit patterns, forming a second processed layer on the various test circuit patterns, measuring a thickness of the formed second processed layer, and performing planarization processing on the formed second processed layer, creating, in advance,
   (1) a first actual measurement database related to a relationship between the circuit pattern and a sectional structure of the second processed layer formed thereon,
   (2) a second actual measurement database related to a relationship between a circumferential length of the circuit pattern and the thickness of the second processed layer formed thereon, and
   (3) a third actual measurement database related to a relationship between the circuit pattern and a planarization rate of the second processed layer formed thereon;
   obtaining, in advance,
   (4) a reference film thickness $T_{blk}$ of the second processed layer formed on a region in which no circuit pattern exists;
   (A) segmenting a first processed layer to be formed on the substrate into grid-like meshes having a predetermined size, and obtaining a pattern area ratio $\alpha_{ij}$ occupied by the circuit pattern to be formed on the first processed layer in each mesh (i,j) and further obtaining a circumferential length $L_{ij}$ of the circuit pattern in each mesh (i,j);
   (B) obtaining an initial thickness $T_{2\_INI\_ij}$ of the second processed layer in each mesh (i,j) from the circumferential length $L_{ij}$ of the circuit pattern based on the second actual measurement database; and
   (C) predicting the film thickness of the second processed layer after planarization of the second processed layer from an initial film thickness predicted value $Pr_{ij}$ of the second processed layer in the mesh (i,j) obtained based on the pattern area ratio $\alpha_{ij}$ and the reference film thickness $T_{blk}$ of the second processed layer, the initial thickness $T_{2\_INI\_ij}$ of the second processed layer, and an amount of planarization $H_{ij}$ of the second processed layer in the mesh (i,j) obtained based on the first actual measurement database, the second actual measurement database, and the third actual measurement database.

2. The film thickness prediction method according to claim 1, wherein the planarization processing is performed according to a chemical mechanical polishing method.

3. The film thickness prediction method according to claim 2, wherein the initial film thickness predicted value $Pr_{ij}$ of the second processed layer is obtained based on the reference film thickness $T_{blk}$ of the second processed layer, the pattern area ratio $\alpha_{ij}$, a thickness $T_{1\_INI\_ij}$ of the first processed layer in the mesh (i,j), and the circumferential length $L_{ij}$ of the circuit pattern.

4. The film thickness prediction method according to claim 3, wherein the amount of planarization $H_{ij}$ of the second processed layer is obtained based on a relationship between polishing pressure and the planarization rate according to a change in sectional structure of the second processed layer in the mesh (i,j) during planarization processing of the second processed layer.

5. The film thickness prediction method according to claim 4, wherein the initial film thickness predicted value $Pr_{ij}$ of the second processed layer is obtained by the following equation (1) and a film thickness $T_{2\_END\_ij}$ of the second processed layer at completion of the planarization processing when no second processed layer exists on the circuit pattern of the first processed layer is predicted by the following equation (2), $$Pr_{ij} = (1-\alpha_{ij})T_{1\_INI\_ij} + T_{blk}(1+k_1 \cdot L_{ij}) k_2 \cdot k_3 \quad (1)$$

$$T_{2\_END\_ij} = Pr_{ij} - k_4 \cdot H_{ij} \quad (2)$$

where the initial film thickness predicted value $Pr_{ij}$, $T_{2\_END\_ij}$ and $H_{ij}$ are values with reference to a top surface of the circuit pattern of the first processed layer,
   $k_1$ is a constant,
   $k_2$ is a coefficient according to the area of the circuit pattern,
   $k_3$ is a coefficient according to formation of the second processed layer, and
   $k_4$ is a coefficient according to planarization processing of the second processed layer.

6. The film thickness prediction method according to claim 1, wherein the test circuit pattern is a circuit pattern with a pattern area ratio and a circumferential length intermittently or continuously changed.

7. The film thickness prediction method according to claim 6, wherein the test circuit pattern is a TEG pattern.

8. A layout design method of designing a layout of a semiconductor circuit based on semiconductor integrated circuit design data, comprising the steps of:
   by using a test substrate provided with various test circuit patterns, forming a second processed layer on the various test circuit patterns, measuring a thickness of the formed second processed layer, and performing planarization processing on the formed second processed layer, creating, in advance,
   (1) a first actual measurement database related to a relationship between the circuit pattern and a sectional structure of the second processed layer formed thereon,
   (2) a second actual measurement database related to a relationship between a circumferential length of the circuit pattern and the thickness of the second processed layer formed thereon, and
   (3) a third actual measurement database related to a relationship between the circuit pattern and a planarization rate of the second processed layer formed thereon;
   obtaining, in advance,
   (4) a reference film thickness $T_{blk}$ of the second processed layer formed on a region in which no circuit pattern exists;
   (A) segmenting a first processed layer to be formed on the substrate into grid-like meshes having a predetermined size, and obtaining a pattern area ratio $\alpha_{ij}$ occupied by the circuit pattern to be formed on the first processed layer in each mesh (i,j) and further obtaining a circumferential length $L_{ij}$ of the circuit pattern in each mesh (i,j);

(B) obtaining an initial thickness $T_{2\_INI\_ij}$ of the second processed layer in each mesh (i,j) from the circumferential length $L_{ij}$ of the circuit pattern based on the second actual measurement database; and (C) predicting the film thickness of the second processed layer after planarization of the second processed layer from an initial film thickness predicted value $Pr_{ij}$ of the second processed layer in the mesh (i,j) obtained based on the pattern area ratio $\alpha_{ij}$ and the reference film thickness $T_{blk}$ of the second processed layer, the initial thickness $T_{2\_INI\_ij}$ of the second processed layer, and an amount of planarization $H_{ij}$ of the second processed layer in the mesh (i,j) obtained based on the first actual measurement database, the second actual measurement database, and the third actual measurement database; and performing capacitance extraction based on the predicted film thickness of the second processed layer and performing delay calculation or timing analysis or delay calculation and timing analysis.

9. A layout design method of designing a layout of a semiconductor circuit based on semiconductor integrated circuit design data, comprising the steps of:

by using a test substrate provided with various test circuit patterns, forming a second processed layer on the various test circuit patterns, measuring a thickness of the formed second processed layer, and performing planarization processing on the formed second processed layer, creating, in advance, (1) a first actual measurement database related to a relationship between the circuit pattern and a sectional structure of the second processed layer formed thereon, (2) a second actual measurement database related to a relationship between a circumferential length of the circuit pattern and the thickness of the second processed layer formed thereon, and (3) a third actual measurement database related to a relationship between the circuit pattern and a planarization rate of the second processed layer formed thereon;

obtaining, in advance, (4) a reference film thickness $T_{blk}$ of the second processed layer formed on a region in which no circuit pattern exists;

(A) segmenting a first processed layer to be formed on the substrate into grid-like meshes having a predetermined size, and obtaining a pattern area ratio $\alpha_{ij}$ occupied by the circuit pattern to be formed on the first processed layer in each mesh (i,j) and further obtaining a circumferential length $L_{ij}$ of the circuit pattern in each mesh (i,j);

(B) obtaining an initial thickness $T_{2\_INI\_ij}$ of the second processed layer in each mesh (i,j) from the circumferential length $L_{ij}$ of the circuit pattern based on the second actual measurement database; and (C) predicting the film thickness of the second processed layer after planarization of the second processed layer from an initial film thickness predicted value $Pr_{ij}$ of the second processed layer in the mesh (i,j) obtained based on the pattern area ratio $\alpha_{ij}$ and the reference film thickness $T_{blk}$ of the second processed layer, the initial thickness $T_{2\_INI\_ij}$ of the second processed layer, and an amount of planarization $H_{ij}$ of the second processed layer in the mesh (i,j) obtained based on the first actual measurement database, the second actual measurement database, and the third actual measurement database; and providing a dummy pattern on the first processed layer so that the predicted film thickness of the second processed layer may fall within a desired film thickness range.

10. A mask pattern design method of a mask pattern to be formed on an exposure mask used for the pattern formation, when a pattern is formed on a first processed layer formed on a substrate, then a second processed layer is formed on an entire surface, and the second processed layer is planarized to fabricate a semiconductor integrated circuit, comprising the steps of:

by using a test substrate provided with various test circuit patterns, forming a second processed layer on the various test circuit patterns, measuring a thickness of the formed second processed layer, and performing planarization processing on the formed second processed layer, creating, in advance, (1) a first actual measurement database related to a relationship between the circuit pattern and a sectional structure of the second processed layer formed thereon, (2) a second actual measurement database related to a relationship between a circumferential length of the circuit pattern and the thickness of the second processed layer formed thereon, and (3) a third actual measurement database related to a relationship between the circuit pattern and a planarization rate of the second processed layer formed thereon;

obtaining, in advance, (4) a reference film thickness $T_{blk}$ of the second processed layer formed on a region in which no circuit pattern exists;

(A) segmenting a first processed layer to be formed on the substrate into grid-like meshes having a predetermined size, and obtaining a pattern area ratio $\alpha_{ij}$ occupied by the circuit pattern to be formed on the first processed layer in each mesh (i,j) and further obtaining a circumferential length $L_{ij}$ of the circuit pattern in each mesh (i,j);

(B) obtaining an initial thickness $T_{2\_INI\_ij}$ of the second processed layer in each mesh (i,j) from the circumferential length $L_{ij}$ of the circuit pattern based on the second actual measurement database; and (C) predicting the film thickness of the second processed layer after planarization of the second processed layer from an initial film thickness predicted value $Pr_{ij}$ of the second processed layer in the mesh (i,j) obtained based on the pattern area ratio $\alpha_{ij}$ and the reference film thickness $T_{blk}$ of the second processed layer, the initial thickness $T_{2\_INI\_ij}$ of the second processed layer, and an amount of planarization $H_{ij}$ of the second processed layer in the mesh (i,j) obtained based on the first actual measurement database, the second actual measurement database, and the third actual measurement database;

designing a layout of a semiconductor circuit by providing a dummy pattern of the first processed layer so that the predicted film thickness of the second processed layer may fall within a desired film thickness range; and designing a mask pattern for exposure mask for the first processed layer based on the layout design of the semiconductor circuit.

11. A fabrication method of semiconductor integrated circuit of fabricating a semiconductor integrated circuit by forming a pattern on a first processed layer formed on a substrate, then forming a second processed layer on an entire surface, and planarizing the second processed layer, comprising the steps of:

by using a test substrate provided with various test circuit patterns, forming a second processed layer on the various test circuit patterns, measuring a thickness of the formed second processed layer, further performing planarization processing on the formed second processed layer, creating, in advance, (1) a first actual measurement database related to a relationship between the circuit pattern and a sectional structure of the second processed layer formed thereon, (2) a second actual measurement database related to a relationship between a circumferential length of the circuit pattern and the thickness of the second processed layer formed thereon, and (3) a third actual measurement database related to a relationship between the circuit pattern and a planarization rate of the second processed layer formed thereon;

obtaining, in advance, (4) a reference film thickness $T_{blk}$ of the second processed layer formed on a region in which no circuit pattern exists;

(A) segmenting a first processed layer to be formed on the substrate into grid-like meshes having a predetermined size, and obtaining a pattern area ratio $\alpha_{ij}$ occupied by the circuit pattern to be formed on the first processed layer in each mesh (i,j) and further obtaining a circumferential length $L_{ij}$ of the circuit pattern in each mesh (i,j);

(B) obtaining an initial thickness $T_{2\_INI\_ij}$ of the second processed layer in each mesh (i,j) from the circumferential length $L_{ij}$ of the circuit pattern based on the second actual measurement database; and (C) predicting the film thickness of the second processed layer after planarization of the second processed layer from the initial film thickness predicted value $Pr_{ij}$ of the second processed layer in the mesh (i,j) obtained based on the pattern area ratio $\alpha_{ij}$ and the reference film thickness $T_{blk}$ of the second processed layer, the initial thickness $T_{2\_INI\_ij}$ of the second processed layer, and an amount of planarization $H_{ij}$ of the second processed layer in the mesh (i,j) obtained based on the first actual measurement database, the second actual measurement database, and the third actual measurement database;

designing a layout of a semiconductor circuit by providing a dummy pattern is provided on the first processed layer so that the predicted film thickness of the second processed layer may fall within a desired film thickness range; and forming the circuit pattern on the first processed layer based on the layout design of the semiconductor circuit.

* * * * *